(12) United States Patent
Kim et al.

(10) Patent No.: US 12,557,418 B2
(45) Date of Patent: Feb. 17, 2026

(54) IMAGE SENSOR IN WHICH PIXELS HAVE SUBSTANTIALLY UNIFORM HEIGHTS AND A METHOD OF FABRICATING THE SAME

(71) Applicant: SAMSUNG ELECTRONICS CO., LTD., Suwon-si (KR)

(72) Inventors: Dongchan Kim, Seongnam-si (KR); Hwiyoung Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 605 days.

(21) Appl. No.: 17/886,578

(22) Filed: Aug. 12, 2022

(65) Prior Publication Data

US 2023/0136919 A1   May 4, 2023

(30) Foreign Application Priority Data

Oct. 28, 2021  (KR) .......................... 10-2021-0146058

(51) Int. Cl.
  *H10F 39/00*  (2025.01)
(52) U.S. Cl.
  CPC ......... *H10F 39/807* (2025.01); *H10F 39/014* (2025.01); *H10F 39/8053* (2025.01); *H10F 39/8057* (2025.01); *H10F 39/8063* (2025.01)
(58) Field of Classification Search
  CPC .. H10F 39/807; H10F 39/014; H10F 39/8053; H10F 39/8057; H10F 39/8063;
  (Continued)

(56) References Cited

U.S. PATENT DOCUMENTS

| 8,530,264 | B2 | 9/2013 | De Munck et al. |
| 8,604,581 | B2 | 12/2013 | Ueno et al. |

(Continued)

FOREIGN PATENT DOCUMENTS

| JP | 2009-232392 A | 10/2009 |
| KR | 10-0922548 | 10/2009 |

(Continued)

OTHER PUBLICATIONS

Office Action dated Jul. 12, 2025 issued in corresponding Korean Patent Application No. 10-2021-0146058. (Note: US 2018/0301502 A1 already submitted.).

*Primary Examiner* — Mohammad M Hoque
(74) *Attorney, Agent, or Firm* — Morgan, Lewis & Bockius LLP

(57) ABSTRACT

An image sensor includes: a substrate including an active region and a peripheral region, unit pixels disposed on the active region, device isolation patterns defining the unit pixels disposed on the active region, a light-shield layer on the substrate and having a grid structure defining optical transmission regions, color filters on the light-shield layer, and microlenses on the color filters. The device isolation patterns include first device isolation patterns and a second device isolation pattern, wherein the first device isolation patterns are disposed on a central portion of the active region, and the second device isolation pattern is between the first device isolation patterns and the peripheral region. The first device isolation patterns have a first top surface substantially parallel to a bottom surface of the substrate. The second device isolation pattern has a second top surface, wherein the second top surface approaches the bottom surface of the substrate in a direction toward the peripheral region.

17 Claims, 16 Drawing Sheets

(58) Field of Classification Search
CPC ...... H10F 39/024; H10F 39/18; H10F 39/182; H10F 39/199; H10F 39/811; H10F 39/8037
USPC .......................................................... 257/292
See application file for complete search history.

(56) References Cited

U.S. PATENT DOCUMENTS

| | | |
|---|---|---|
| 8,704,282 B2 | 4/2014 | Marty et al. |
| 10,032,819 B2 | 7/2018 | Lee et al. |
| 10,784,301 B2 | 9/2020 | Hong et al. |
| 10,944,943 B2 | 3/2021 | Kim et al. |
| 2009/0134439 A1 | 5/2009 | Kim |
| 2012/0153418 A1* | 6/2012 | Nakadate ............ H10F 39/8023 257/E31.127 |
| 2016/0204143 A1* | 7/2016 | Lee ....................... H10F 39/807 257/446 |
| 2018/0301502 A1* | 10/2018 | Lee ....................... H10F 39/026 |
| 2019/0035828 A1 | 1/2019 | Han |
| 2020/0077055 A1* | 3/2020 | Kim .................... H10F 39/8023 |
| 2021/0193704 A1 | 6/2021 | Sun |

FOREIGN PATENT DOCUMENTS

| | | |
|---|---|---|
| KR | 10-0935757 | 1/2010 |
| KR | 10-2016-0087428 A | 7/2017 |
| KR | 10-2198344 | 1/2021 |

\* cited by examiner

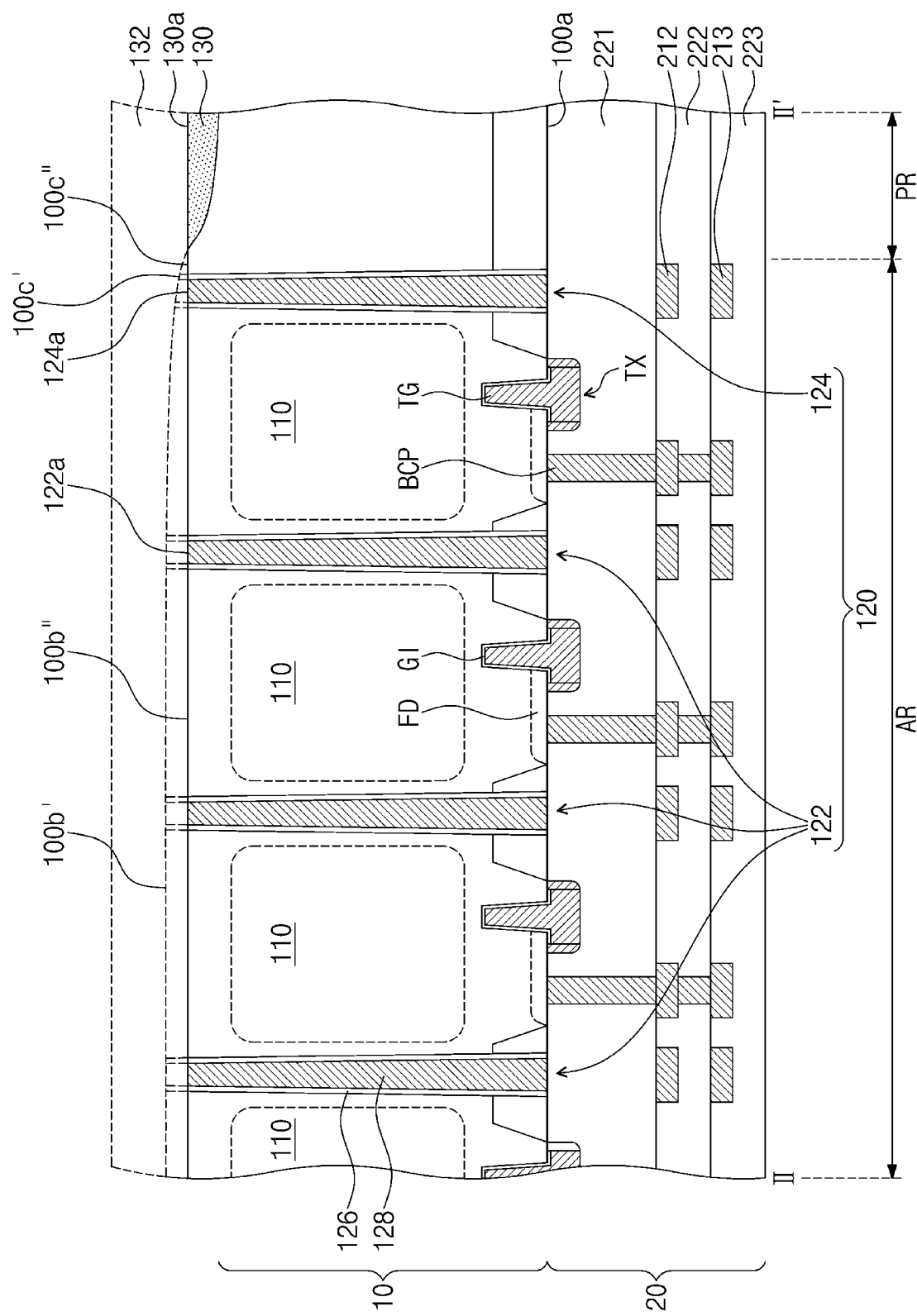

IMAGE SENSOR IN WHICH PIXELS HAVE SUBSTANTIALLY UNIFORM HEIGHTS AND A METHOD OF FABRICATING THE SAME

CROSS-REFERENCE TO RELATED APPLICATIONS

This patent application claims priority under 35 U.S.C § 119 to Korean Patent Application No. 10-2021-0146058, filed on Oct. 28, 2021 in the Korean Intellectual Property Office, the disclosure of which is incorporated by reference herein in its entirety.

TECHNICAL FIELD

Exemplary embodiments of the present inventive concept relate to an image sensor and a method of fabricating the image sensor.

DISCUSSION OF THE RELATED ART

An image sensor is a semiconductor device that converts optical images into electrical signals. An image sensor may be classified as a charge coupled device (CCD) type or a complementary metal oxide semiconductor (CMOS) type. A CMOS type image sensor (CIS) may include a plurality of two-dimensionally arranged pixels. Each of the pixels includes a photodiode (PD). The photodiode serves to convert incident light into electrical signals.

The CIS has been widely used in devices including, for example, digital cameras, cellular phones, and automobiles. Because the photodiode in the CIS can convert incident light into electrical signals, the CIS can absorb a portion of the incident image light and generate an image charge upon the absorption. Accordingly, the CIS can be utilized to produce digital images representing the external scenes.

SUMMARY

An exemplary embodiment of the present inventive concept provides an image sensor whose pixels have substantially uniform heights and a method of fabricating the same.

An exemplary embodiment of the present inventive concept provides an image sensor whose optical properties are improved and a method of fabricating the same.

According to an exemplary embodiment of the present inventive concept, an image sensor may include: a substrate that includes an active region and a peripheral region; a plurality of unit pixels disposed on the active region; a plurality of device isolation patterns, wherein the plurality of unit pixels disposed on the active region is defined by the plurality of device isolation patterns; a light-shield layer on the substrate and having a grid structure, wherein a plurality of optical transmission regions is defined based on the grid structure; a plurality of color filters disposed on the light-shield layer; and a plurality of microlenses disposed on the color filters. In addition, the device isolation patterns may include a plurality of first device isolation patterns and a second device isolation pattern, wherein the first device isolation patterns are disposed on a central portion of the active region, and the second device isolation pattern is between the first device isolation patterns and the peripheral region. The plurality of first device isolation patterns may have a first top surface substantially parallel to a bottom surface of the substrate. The second device isolation pattern may have a second top surface, wherein the second top surface approaches the bottom surface of the substrate in a direction toward the peripheral region.

According to an exemplary embodiment of the present inventive concept, an image sensor may include: a substrate including an active region and a peripheral region at least partially surrounding the active region; a plurality of device isolation patterns extending from a top surface of the substrate and penetrating the substrate on the active region, wherein a plurality of unit pixels is disposed between the plurality of device isolation patterns; a plurality of photoelectric conversion regions in the substrate and respectively at the plurality of unit pixels; a plurality of impurity regions in the substrate and respectively at the plurality of unit pixels, wherein the plurality of impurity regions is adjacent to a bottom surface of the substrate; a conductive line pattern in the substrate or on the bottom surface of the substrate, wherein the conductive line pattern vertically overlaps the device isolation pattern; a color filter disposed on the top surface of the substrate; and a microlens array disposed on the color filter. A plurality of first device isolation patterns that are outermost positioned among the device isolation patterns may have a first top surface at a level lower than a level of the top surface of the substrate on the peripheral region. A plurality of second device isolation patterns of the device isolation patterns may have a second surface on the same plane as that of the top surface of the substrate on the peripheral region. The second device isolation patterns may be in an area surrounded by the first device isolation patterns.

According to an exemplary embodiment of the present inventive concept, a method of fabricating an image sensor may include: providing a substrate that includes an active region and a peripheral region; forming a plurality of trenches on a bottom surface of the substrate, wherein a plurality of unit pixels disposed on the active region are defined based on the trenches; forming a plurality of device isolation patterns that fill the trenches; doping the unit pixels with impurities to form a plurality of photoelectric conversion regions; forming a plurality of transistors and a conductive line pattern on the bottom surface of the substrate; exposing top surfaces of the device isolation patterns by performing a first planarization process on a top surface of the substrate, wherein the top surfaces of the device isolation patterns are at a level higher than a level of the top surface of the substrate on the peripheral region; and allowing the top surface of the substrate to undergo a second planarization process. After the second planarization process on the top surface of the substrate, a first top surface of a first device isolation pattern may be at a level lower than the level of the top surface of the substrate on the peripheral region. The first device isolation pattern may be adjacent to the peripheral region. After the second planarization process, a second top surface of a second one of the device isolation patterns may be at a level the same as the level of the top surface of the substrate on the peripheral region. The second device isolation pattern may be on a central portion of the active region.

BRIEF DESCRIPTION OF THE DRAWINGS

FIGS. 10, 11, 12, 13, 14, 15, 16 and 17 are cross-sectional views showing a method of fabricating an image sensor according to an exemplary embodiment of the present inventive concept.

DETAILED DESCRIPTION

The following will now describe an image sensor according to an exemplary embodiment of the present inventive concept with reference to the accompanying drawings.

Figure 1:
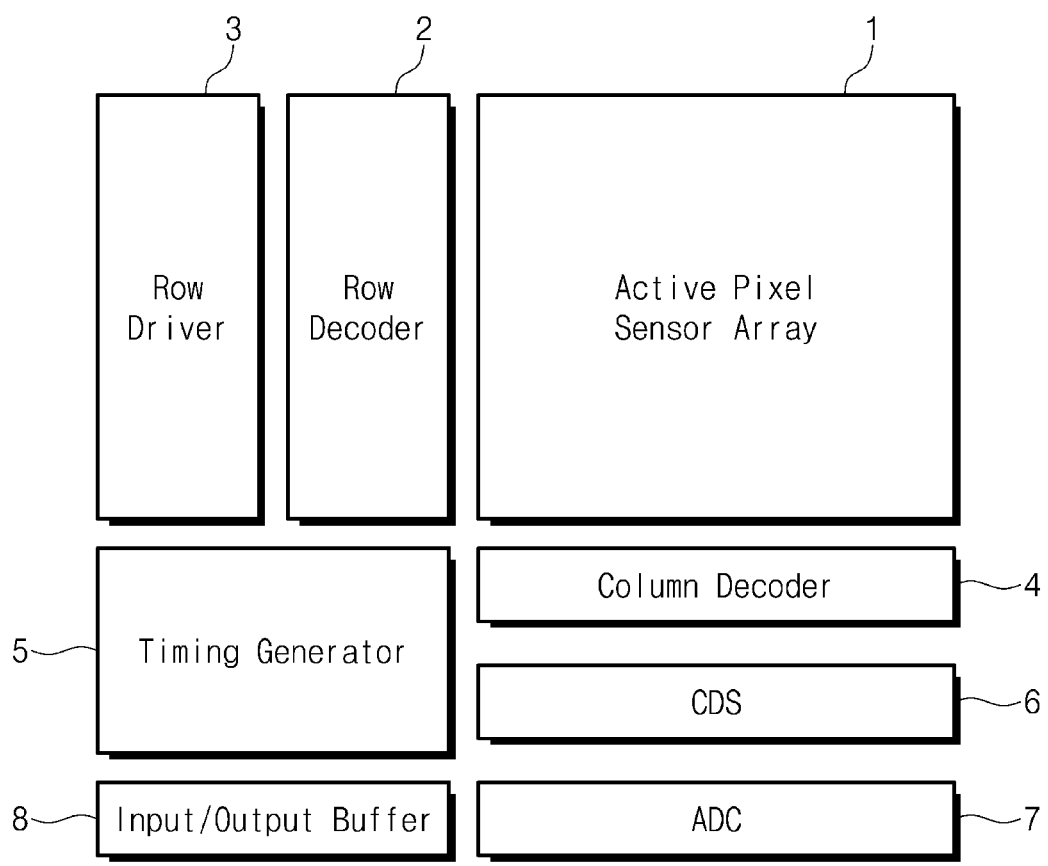
FIG. 1 is a block diagram illustrating an image sensor according to an exemplary embodiment of the present inventive concept.

FIG. 1 illustrates a block diagram that shows an image sensor according to an exemplary embodiment of the present inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of two-dimensionally arranged unit pixels, each of which may be configured to convert optical signals into electrical signals. The active pixel sensor array 1 may be driven by a plurality of driving signals such as a pixel selection signal, a reset signal, and a charge transfer signal from the row driver 3. The correlated double sampler 6 may be provided with the converted electrical signals.

The row driver 3 may provide the active pixel sensor array 1 with several driving signals. For example, several unit pixels may be driven in accordance with a decoded result obtained from the row decoder 2. When the unit pixels are arranged in a matrix shape, the driving signals may be provided to each row.

The timing generator 5 may provide timing and control signals to the row decoder 2 and the column decoder 4.

The correlated double sampler 6 may receive the electrical signals generated from the active pixel sensor array 1, and may hold and sample the received electrical signals. In addition, the correlated double sampler 6 may perform a double sampling operation to sample a specific noise level and a signal level of the electrical signal, and then may output a difference level corresponding to a difference between the noise level and the signal level.

The analog-to-digital converter 7 may convert analog signals into digital signals, and then may output the converted digital signals. For example, the analog signals may correspond to the difference level received from the correlated double sampler 6.

The input/output buffer 8 may latch the digital signals and may then sequentially output the latched digital signals to an image signal processing unit in response to the decoded result obtained from the column decoder 4.

Figure 2:
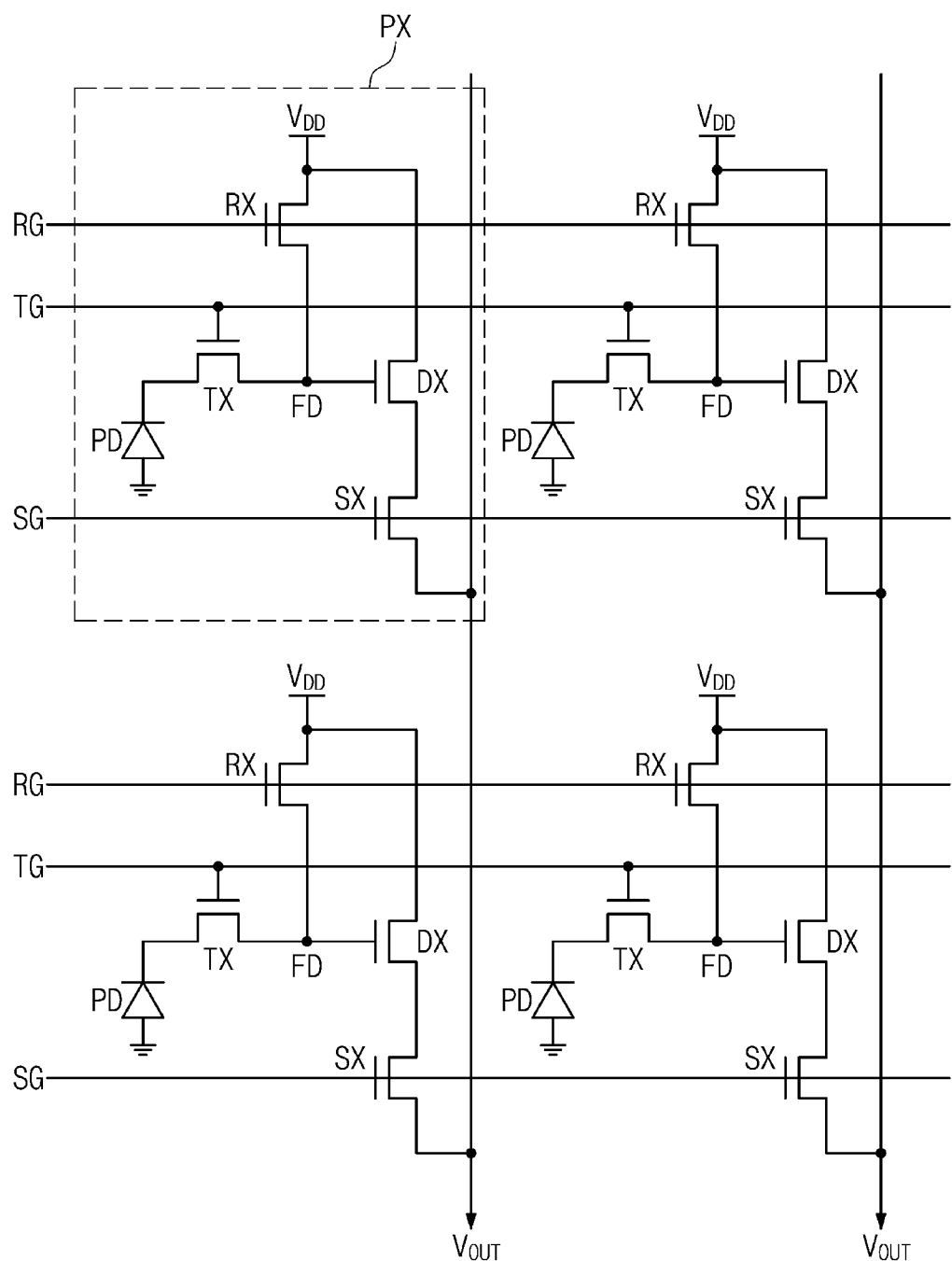
FIG. 2 is a circuit diagram illustrating an active pixel sensor array of an image sensor according to an exemplary embodiment of the present inventive concept.

FIG. 2 illustrates a circuit diagram showing an active pixel sensor array of an image sensor according to an exemplary embodiment of the present inventive concept.

FIGS. 1 and 2, the active pixel sensor array 1 may include a plurality of unit pixels PX. The unit pixels PX may be arranged in a matrix shape. Each of the unit pixels PX may include a transfer transistor TX and logic transistors RX, SX, and DX. For example, the logic transistors RX, SX, and DX may include a reset transistor RX, a selection transistor SX, and a drive transistor DX. The transfer transistor TX may include a transfer gate TG. Each of the unit pixels PX may further include a photoelectric conversion element PD and a floating diffusion region FD.

The photoelectric conversion element PD may create and accumulate photo-charges in proportion to an amount of externally incident light. The photoelectric conversion element PD may include, for example, a photodiode, phototransistor, a photo-gate, a pinned photodiode, or a combination thereof. The transfer transistor TX may transfer charges generated in the photoelectric conversion element PD into the floating diffusion region FD. The floating diffusion region FD may accumulate and store charges that are generated and transferred from the photoelectric conversion element PD. The drive transistor DX may be controlled by an amount of photo-charges accumulated in the floating diffusion region FD.

The reset transistor RX may periodically reset the charges accumulated in the floating diffusion region FD. For example, the reset transistor RX may have a drain electrode, which is connected to the floating diffusion region FD, and a source electrode which is connected to a power voltage $V_{DD}$. When the reset transistor RX is turned on, the floating diffusion region FD may be supplied with the power voltage $V_{DD}$ that is connected to the source electrode of the reset transistor RX. Accordingly, when the reset transistor RX is turned on, the charges accumulated in the floating diffusion region FD may be exhausted, and thus, the floating diffusion region FD may be reset.

The drive transistor DX may be configured as a source follower buffer amplifier. For example, the drive transistor DX may amplify a variation in electrical potential of the floating diffusion region FD and may output the amplified electrical potential to an output line $V_{OUT}$.

The selection transistor SX may select each row of the unit pixels PX to be readout. When the selection transistor SX is turned on, the power voltage $V_{DD}$ may be applied to a drain electrode of the drive transistor DX.

Figure 3:
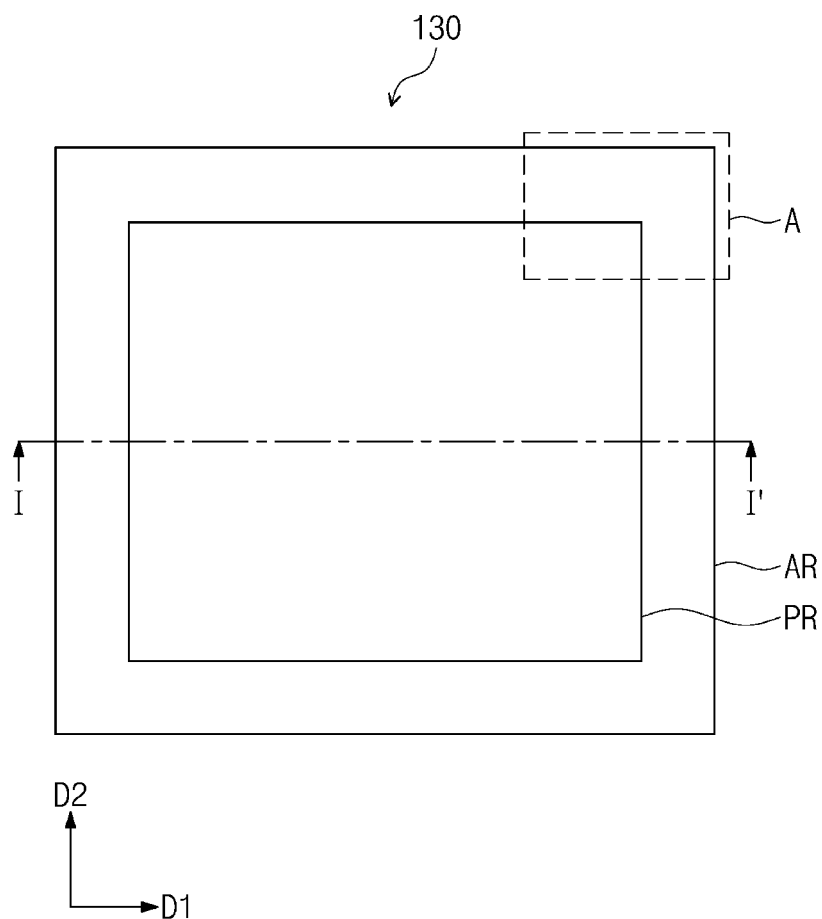
FIG. 3 is a plan view illustrating a regional division of an image sensor according to an exemplary embodiment of the present inventive concept.
Figure 4:
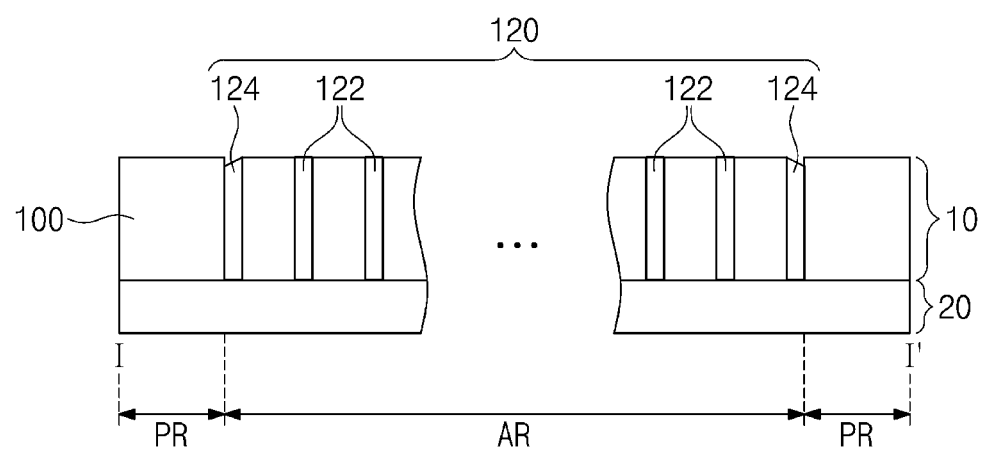
FIG. 4 is a cross-sectional view taken along line I-I' of FIG. 3, showing an image sensor.
Figure 5:
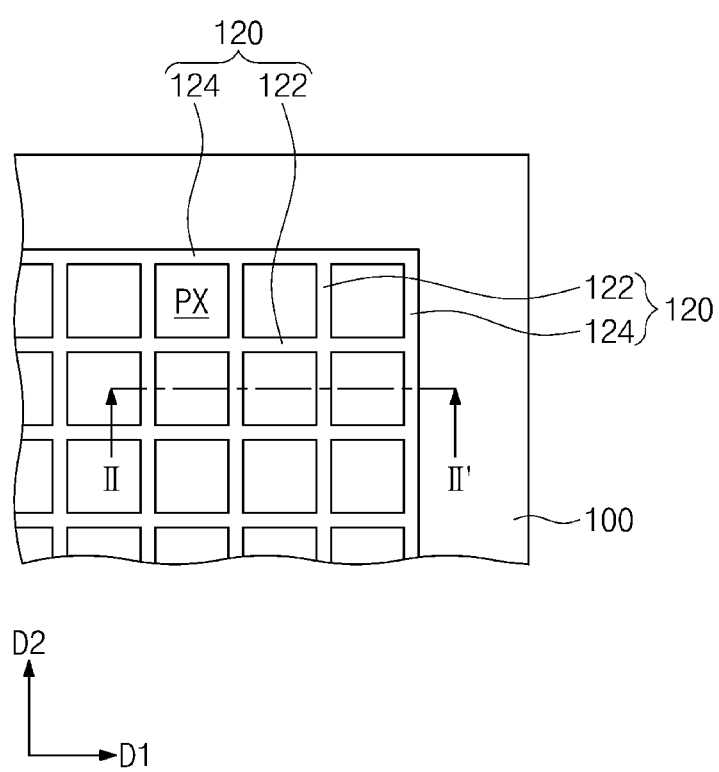
FIG. 5 is an enlarged plan view of section A of FIG. 3.
Figure 6:
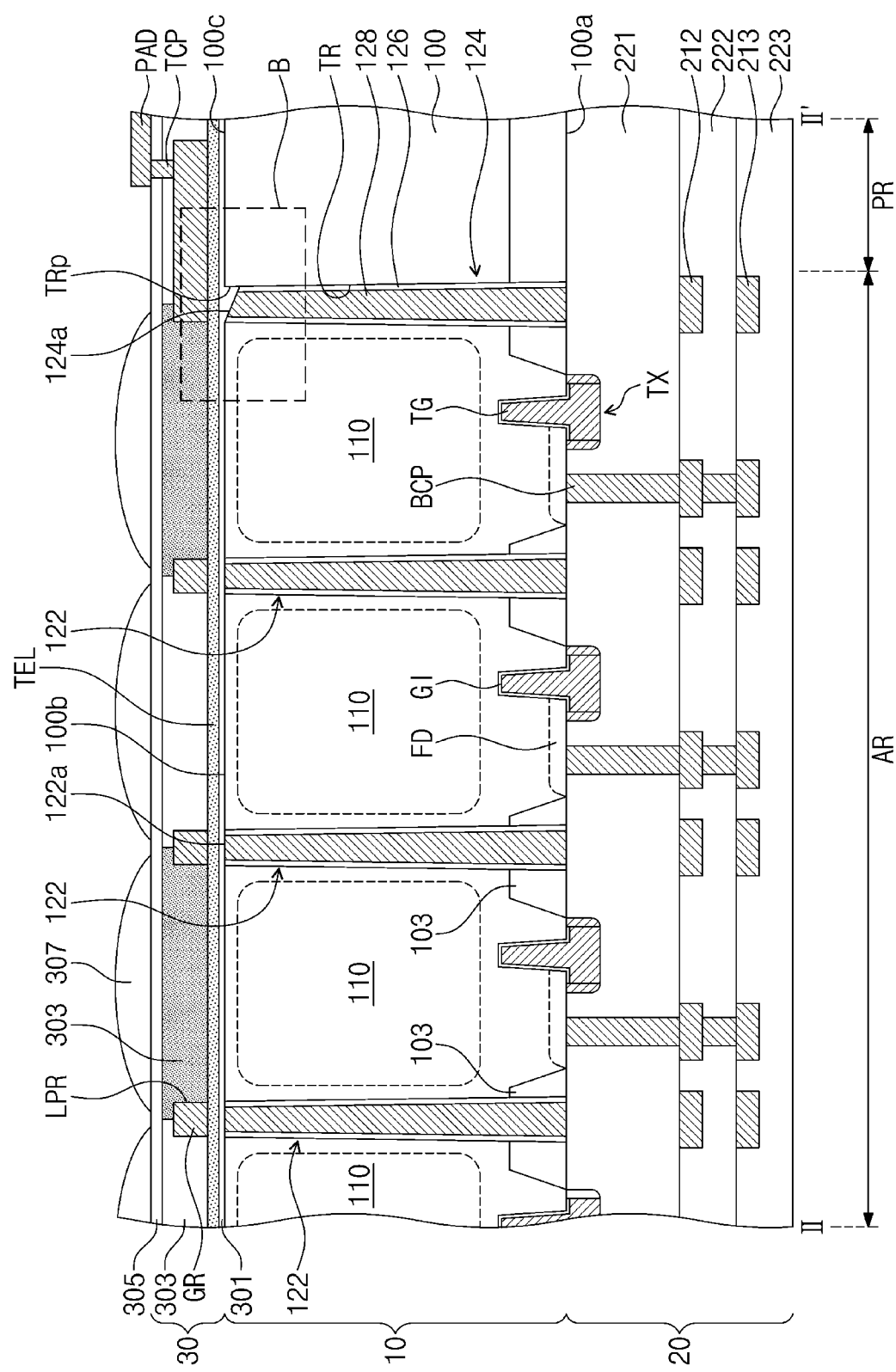
FIG. 6 is a cross-sectional view taken along line II-II' of FIG. 5.
Figure 7:
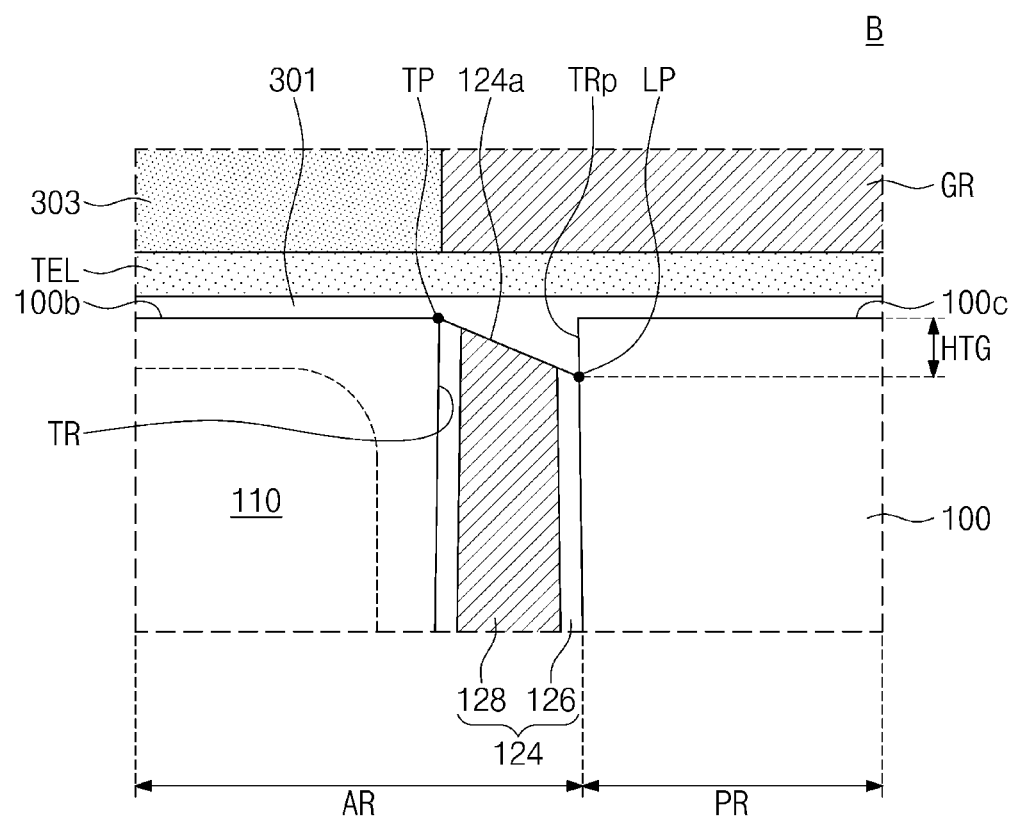
FIGS. 7 and 8 illustrate enlarged views section B of FIG. 6.
Figure 8:
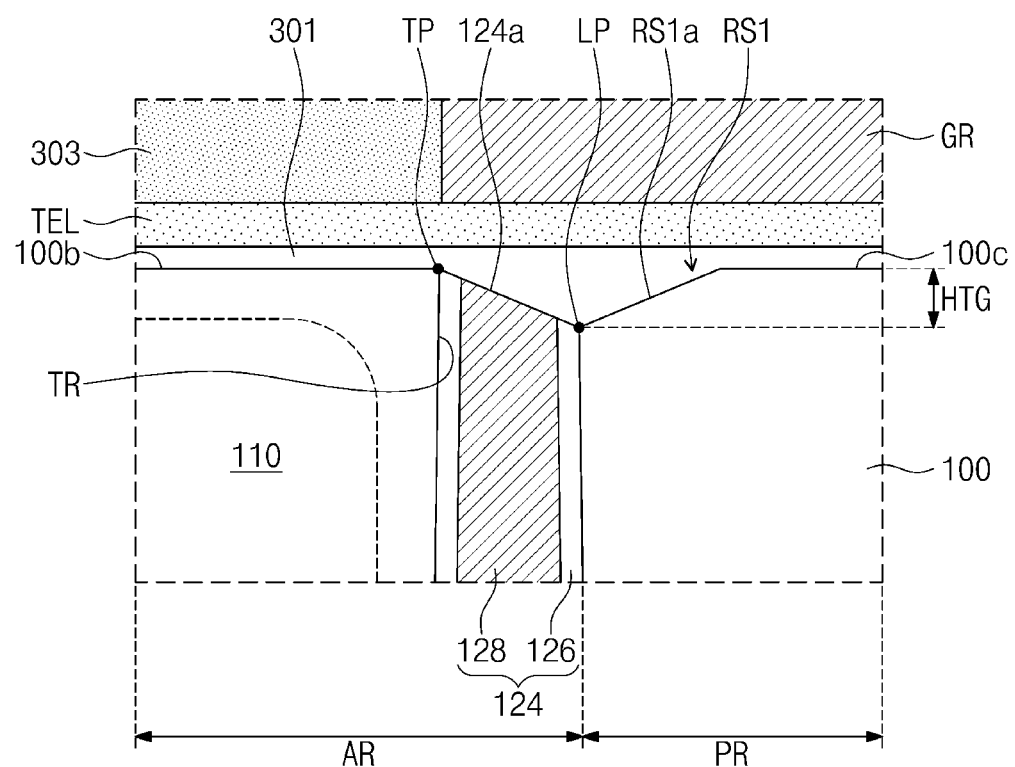

FIG. 3 is a plan view showing regional division of an image sensor according to an exemplary embodiment of the present inventive concept. FIG. 4 is a simplified cross-sectional view taken along line I-I' of FIG. 3. FIG. 4 shows positions and shapes of first device isolation patterns. FIG. 5 illustrates an enlarged view that shows section A of FIG. 3. FIG. 6 illustrates a cross-sectional view taken along line II-II' of FIG. 5. FIGS. 7 and 8 illustrate enlarged views that show section B of FIG. 6.

Referring to FIGS. 3 to 7, an image sensor according to an exemplary embodiment of the present inventive concept may include a photoelectric conversion layer 10, a wiring layer 20, and an optical transmission layer 30. The photoelectric conversion layer 10 may be interposed between the wiring layer 20 and the optical transmission layer 30. The photoelectric conversion layer 10 may include a semiconductor substrate 100 and photoelectric conversion regions 110 provided in the semiconductor substrate 100. The photoelectric conversion regions 110 may convert externally incident light into electrical signals.

The semiconductor substrate 100 may have a first surface 100a and a second surface 100b that are opposite to each other. The wiring layer 20 may be disposed on the first surface 100a of the semiconductor substrate 100, and the optical transmission layer 30 may be disposed on the second surface 100b of the semiconductor substrate 100.

The semiconductor substrate 100 may be, for example, an epitaxial layer formed on a bulk silicon substrate having a first conductivity type (e.g., p-type), which is the same as that of the epitaxial layer. The bulk silicon substrate may be removed in an image sensor fabrication process, where the semiconductor substrate 100 may be formed from the epitaxial layer having the first conductivity type. In addition, the semiconductor substrate 100 may be a bulk semiconductor substrate including a well of the first conductivity type. In contrast, the semiconductor substrate 100 may include an epitaxial layer having a second conductivity type (e.g., n-type), a bulk silicon substrate having the second conductivity type, or a silicon-on-insulator (SOI) substrate.

The semiconductor substrate 100 may include an active region AR and a peripheral region. The active region AR is disposed on a center of the semiconductor 100, and the peripheral region PR at least partially surrounds the active region AR. A plurality of unit pixels PX may be disposed on the active region AR. The peripheral region PR may be a peripheral portion of the active region AR, and the unit pixel PX may not be provided on the peripheral portion. For example, as illustrated in FIG. 6, the peripheral region PR may be provided with a pad PAD. The image sensor may transmit and receive an external signal through the pad PAD.

The active region AR may include a plurality of unit pixels PX. The unit pixels PX may be two-dimensionally arranged in first and second directions D1 and D2 that intersect each other. For example, the unit pixels PX may be arranged in a matrix shape along the first and second directions D1 and D2.

The semiconductor substrate 100 may be provided in the active region AK with first device isolation patterns 120 adjacent to the second surface 100b, and the first device isolation patterns 120 may define a plurality of unit pixels PX. For example, the first device isolation patterns 120 may be arranged along the first direction D1 and the second direction D2, and a planar shape of an entirety of the first device isolation patterns 120 may have a grid structure. For example, portions of the first device isolation patterns 120 may extend in the first direction D1 and may be arranged along the second direction D2, and other portions of the first device isolation patterns 120 may extend in the second direction D2 and may be arranged along the first direction D1. For example, each of the first device isolation patterns 120 may extend between a pair of neighboring unit pixels PX. A single unit pixel PX may be defined to indicate an area surrounded by neighboring first device isolation patterns 120.

The first device isolation patterns 120 may be provided in a trench TR that penetrates the semiconductor substrate 100. For example, the trench TR may have a depth that is substantially the same as a thickness of the semiconductor substrate 100. The trench TR may have a width that gradually increases in a direction from the second surface 100b toward the first surface 100a of the semiconductor substrate 100. However, the present inventive concept is not limited thereto.

The first device isolation patterns 120 may include first sub-device isolation patterns 122 and second sub-device isolation patterns 124. The first sub-device isolation patterns 122 may be positioned on a central portion of the active region AR and second sub-device isolation patterns 124 positioned on a peripheral portion of the active region AR. For example, as shown in FIG. 4, in the active region AR, the second sub-device isolation patterns 124 may be disposed adjacent to the peripheral region PR, and the first sub-device isolation patterns 122 may be positioned in an area surrounded by the second sub-device isolation patterns 124. The first device isolation patterns 120 may have the second sub-device isolation patterns 124 at portions that are disposed adjacent to an outermost portion in the active region AR and are positioned between the peripheral region PR and the first sub-device isolation patterns 122.

FIGS. 4 to 6 depict that the second sub-device isolation patterns 124 are outermost positioned ones of the first device isolation patterns 120, but the present inventive concepts are not limited thereto. For example, the second sub-device isolation patterns 124 may constitute a plurality of columns that are arranged between the peripheral region PR and the central portion of the active region AR and are arranged in a direction from the peripheral region PR toward the central portion of the active region AR. The unit pixels PX may be positioned between the columns. For example, at least one or two second sub-device isolation patterns 124 may be disposed between the peripheral region PR and the first sub-device isolation patterns 122. The following description will focus on the embodiment of FIGS. 4 to 6.

As illustrated in FIGS. 4 and 6, each of the first sub-device isolation patterns 122 may have a top surface 122a that is substantially flat. The top surfaces 122a of the first sub-device isolation patterns 122 may be substantially parallel to the first surface 100a of the semiconductor substrate 100. In addition, the top surfaces 122a of the first sub-device isolation patterns 122 may be located at substantially the same level from the first surface 100a of the semiconductor substrate 100. For example, the top surfaces 122a of the first sub-device isolation patterns 122 may be positioned on a substantially flat plane. For example, the top surfaces 122a of the first sub-device isolation patterns 122 may be coplanar with the second surface 100b of the semiconductor substrate 100. For example, the top surfaces 122a of the first sub-device isolation patterns 122 may be located at the same level as that of the second surface 100b of the semiconductor substrate 100 on the peripheral region PR.

In an exemplary embodiment of the present inventive concept, the second surface 100b of the semiconductor substrate 100 may have a third surface 100c at its portion positioned on the peripheral region PR. For example, the second surface 100b may denote an entire top surface of the semiconductor substrate 100, and the third surface 100c may correspond to a portion of the second surface 100b positioned on the peripheral region PR. On the peripheral region PR, the second surface 100b of the semiconductor substrate 100 may be substantially parallel to the first surface 100a of the semiconductor substrate 100.

According to an exemplary embodiment of the present inventive concept, the top surfaces 122a of the first sub-device isolation patterns 122 may be provided on a substantially flat plane on which is provided the third surface 100c of the semiconductor substrate 100 on the peripheral region PR. Therefore, the photoelectric conversion layer 10 may have a flat top surface. Further, a component (or, e.g., the optical transmission layer 30) provided on the semiconductor substrate 100 may be in contact with or attached to the photoelectric conversion layer 10, and a profile of the second surface 100b of the semiconductor substrate 100 may prevent the optical transmission layer 30 from being delaminated from the photoelectric conversion layer 10.

In addition, according to an exemplary embodiment of the present inventive concept, the top surfaces 122a of the first sub-device isolation patterns 122 may be located at the same level as that of the second surface 100b of the semiconductor substrate 100, and this configuration may mean that the semiconductor substrate 100 has a substantially uniform thickness on the active region AR. For example, as a uniform thickness is given to the semiconductor substrate 100, in which the unit pixels PX are provided, there may be a reduction in difference in sensing sensitivity and an increase in sensing properties of the image sensor.

As illustrated in FIGS. 4, 6, and 7, the second sub-device isolation patterns 124 may have their top surfaces 124a located at a lower level than that of the second surface 100b of the semiconductor substrate 100. The top surface 124a of each of the second sub-device isolation patterns 124 may be inclined to the second surface 100b of the semiconductor substrate 100. For example, the top surfaces 124a of the second sub-device isolation patterns 124 may approach the first surface 100a of the semiconductor substrate 100 in a direction toward the peripheral region PR. For example, the top surfaces 124a of the second sub-device isolation pattern may be selected with respect to the second surface 100b of the semiconductor substrate 100. In this case, the top surfaces 124a of the second sub-device isolation patterns 124 may each have a lowermost end LP that is nearest to the peripheral region PR, and an uppermost end TP that stands opposite to the peripheral region PR. A height difference HTG between the uppermost end TP and the lowermost end LP of the top surface 124a of the second sub-device isolation pattern 124 may range from about 1 μm to about 2 μm.

As the second sub-device isolation patterns 124 have their inclined top surfaces 124a, the second sub-device isolation patterns 124 may not fill a partial area TRp on the trench TR positioned on the top surface 124a of the second sub-device isolation pattern 124. The inclined top surface 124a of the second sub-device isolation pattern 124 may be induced by a process for planarizing the top surfaces 122a of the first sub-device isolation patterns 122.

The uppermost end TP of the top surface 124a of the second sub-device isolation patterns 124 may be located at the same level as that of the second surface 100b of the semiconductor substrate 100. For example, the top surfaces 124a of the second sub-device isolation patterns 124 may be inclined downwardly toward the peripheral region PR from the second surface 100b of the semiconductor substrate 100, and except the uppermost end TP, the top surfaces 124a of the second sub-device isolation patterns 124 may be located at a level lower than that of the second surface 100b of the semiconductor substrate 100. The uppermost ends TP of the top surfaces 124a of the second sub-device isolation patterns 124 may be located at the same level from the first surface 100a of the semiconductor substrate 100 as that of the top surfaces 122a of the first sub-device isolation patterns 122.

According to an exemplary embodiment of the present inventive concept, when the second sub-device isolation patterns 124 are arranged to constitute a plurality of columns between the peripheral region PR and the central portion of the active region AR, the second sub-device isolation patterns 124 may all have their inclined top surfaces 124a. In this case, an inclined angle of the top surface 124a of the second sub-device isolation pattern 124 may be changed based on a distance from the peripheral region PR. For example, the inclined angle of the top surface 124a of the second sub-device isolation pattern 124 may decrease as the distance from the peripheral region PR increases. The lowermost end LP of the top surface 124a of each of the second sub-device isolation patterns 124 may be located at a level that becomes higher as the distance from the peripheral region PR increases. The present inventive concept, however, are not limited thereto, and the top surfaces 124a of the second sub-device isolation patterns 124 may be formed to have their inclined angles that is the same irrespective of position or is changed based on position. The following description will focus on the embodiment of FIGS. 4 to 6.

As illustrated in FIG. 7, on the peripheral region PR, the third surface 100c of the semiconductor substrate 100 is substantially parallel to the first surface 100a of the semiconductor substrate 100, but the present inventive concept is not limited thereto. As illustrated in FIG. 8, on the peripheral region PR, the third surface 100c of the semiconductor substrate 100 may have a first recess RS1. The first recess RS1 may be formed extending from the third surface 100c toward the first surface 100a of the semiconductor substrate 100. The first recess RS1 may have one side in contact with the second sub-device isolation pattern 124 in the vicinity of a boundary between the active region AR and the peripheral region PR. The first recess RS1 may have a bottom surface RS1a that is inclined to the third surface 100c of the semiconductor substrate 100. For example, the bottom surface RS1a of the first recess RS1 may approach the first surface 100a of the semiconductor substrate 100 in a direction toward the active region AR. The bottom surface RS1a of the first recess RS1 may have a lowermost end that is nearest to the second sub-device isolation pattern 124 and an uppermost end that stands opposite to the second sub-device isolation pattern 124. The lowermost end of the bottom surface RS1a of the first recess RS1 may be located at the same level as that of the lowermost end LP of the top surface 124a of the second sub-device isolation pattern 124.

For example, the top surface 124a of the second sub-device isolation pattern 124 and the bottom surface RS1a of the first recess RS1 may be connected to each other to form a shape similar to a "V" when viewed in a cross-sectional view. The first recess RS1 provided on the third surface 100c of the semiconductor substrate 100 may be formed by a process for planarizing the top surfaces 122a of the first sub-device isolation patterns 122.

Each of the first device isolation patterns 120 may include a dielectric isolation pattern 126 and a conductive isolation pattern 128.

The dielectric isolation pattern 126 may partially fill the trench TR. For example, the dielectric isolation pattern 126 may conformally cover an inner lateral surface and a bottom surface of the trench TR. The dielectric isolation pattern 126 may include a dielectric material having refractive index that is less than that of the semiconductor substrate 100 (e.g., silicon). For example, the dielectric isolation pattern 126 may include a silicon oxide (SiO) layer, a silicon oxynitride (SiON) layer, or a silicon nitride (SiN) layer.

The conductive isolation pattern 128 may completely fill an unoccupied portion of the trench TR which is not filled with the dielectric isolation pattern 126. For example, in the trench TR, the dielectric isolation pattern 126 may be interposed between the conductive isolation pattern 128 and the semiconductor substrate 100. The conductive isolation pattern 128 and the dielectric isolation pattern 126 may have their top surfaces coplanar with the second surface 100b of the semiconductor substrate 100. The conductive isolation pattern 128 and the dielectric isolation pattern 126 may have their bottom surfaces coplanar with the first surface 100a of the semiconductor substrate 100. The conductive isolation pattern 128 may have a width that gradually increases in a direction from the second surface 100b toward the first surface 100a of the semiconductor substrate 100. The conductive isolation pattern 128 may include a conductive material. For example, the conductive isolation pattern 128 may include n-type doped polysilicon or p-type doped polysilicon. According to an exemplary embodiment of the present inventive concept, the conductive isolation pattern 128 may be omitted if necessary. For example, the first device isolation pattern 120 may include the dielectric isolation pattern 126 that completely fills the trench TR.

The photoelectric conversion regions 110 may be disposed in corresponding unit pixels PX. In an exemplary embodiment, the photoelectric conversion regions 110 may be impurity regions doped with impurities having a second conductivity type (e.g., n-type) opposite to a first conductivity type of the semiconductor substrate 100. For example, the photoelectric conversion regions 110 may be adjacent to the second surface 100*b* of the semiconductor substrate 100 and perpendicularly spaced apart from the first surface 100*a* of the semiconductor substrate 100. Each of the photoelectric conversion regions 110 may have a difference in impurity concentration between a first region adjacent to the first surface 100*a* and a second region adjacent to the second surface 100*b*.

The semiconductor substrate 100 and the photoelectric conversion regions 110 may provide photodiodes. In each of the unit pixels PX, the photodiode may be provided by a p-n junction between the semiconductor substrate 100 of the first conductivity type and the photoelectric conversion region 110 of the second conductivity type. In an exemplary embodiment of the present inventive concept, the photoelectric conversion region 110 which provides the photodiode, may generate and accumulate photo-charges in proportion to intensity of incident light.

The semiconductor substrate 100 may be provided therein with a second device isolation pattern 103 that is adjacent to the first surface 100*a* and defines active patterns. Each of the unit pixels PX may include the active pattern. For example, the active pattern may include a floating diffusion region FD and an impurity region DR.

The second device isolation pattern 103 may have a width which gradually decreases in a direction from the first surface 100*a* toward the second surface 100*b* of the semiconductor substrate 100. In an exemplary embodiment of the present inventive concept, the first device isolation pattern 120 may vertically penetrate the second device isolation pattern 103. The second device isolation pattern 103 may include, for example, a silicon oxide (SiO) layer, a silicon oxynitride (SiON) layer, or a silicon nitride (SiN) layer.

The semiconductor substrate 100 may be provided on its first surface 100*a* with the transfer transistors TX and the logic transistors RX, SX, and DX discussed above with reference to FIG. 2. In an exemplary embodiment of the present inventive concept, the transfer transistor TX may be provided on each of the unit pixels PX. The transfer transistor TX may be electrically connected to the photoelectric conversion region 110.

The transfer transistor TX may include a transfer gate TG and a floating diffusion region FD. The transfer gate TG may include a lower part inserted into the semiconductor substrate 100, and may also include an upper part that is connected to the lower part and protrudes upwardly from the first surface 100*a* of the semiconductor substrate 100. In an exemplary embodiment, a gate dielectric layer GI may be interposed between the transfer gate TG and the semiconductor substrate 100. The floating diffusion region FD may have the second conductivity type (e.g., n-type) opposite to the first conductivity type of the semiconductor substrate 100.

The logic transistors RX, SX, and DX of FIG. 2 may be provided on each of the unit pixels PX. For example, the logic transistors may include the reset transistor RX.

The wiring layer 20 may include first, second, and third interlayer dielectric layers 221, 222, and 223 that covers the transfer transistors TX and the logic transistors RX, SX, and DX, and may also include first and second conductive line patterns 212 and 213. In an exemplary embodiment of the present inventive concept, the first and second conductive line patterns 212 and 213 may be electrically connected through lower contact plugs BCP to the transfer transistors TX and the logic transistors RX, SX, and DX.

The wiring layer 20 may signally process electrical signals that are converted in the photoelectric conversion regions 110. The first and second conductive line patterns 212 and 213 may be disposed in respective first and second interlayer dielectric layers 222 and 223 stacked on the first surface 100*a* of the semiconductor substrate 100. In an exemplary embodiment of the present inventive concept, the first and second conductive line patterns 212 and 213 may be disposed irrespective of arrangement of the photoelectric conversion regions 110. When viewed in a plan view, the first and second conductive line patterns 212 and 213 may run across the photoelectric conversion regions 110.

The optical transmission layer 30 may include a first planarized layer 301, a transparent conductive layer TEL, a light-shield layer GR, color filters 303, and microlenses 307. In an exemplary embodiment of the present inventive concept, the optical transmission layer 30 may condense and filter externally incident light, and the photoelectric conversion layer 10 may receive the focused and filtered light.

The first planarized layer 301 may be provided on the semiconductor substrate 100. The first planarized layer 301 may cover the second surface 100*b* of the semiconductor substrate 100. On the second sub-device isolation patterns 124, the first planarized layer 301 may fill the partial area TRp on the trench TR, where the partial area TRp is not filled with the second sub-device isolation patterns 124. The first planarized layer 301 may include a silicon oxide (SiO) layer.

The transparent conductive layer TEL may be provided on the first planarized layer 301. The transparent conductive layer TEL may cover the active region AR and the peripheral region PR of the semiconductor substrate 100. The first planarized layer 301 may insulate the transparent conductive layer TEL from the semiconductor substrate 100. In an exemplary embodiment of the present inventive concept, the transparent conductive layer TEL may include indium tin oxide (ITO), indium zinc oxide (IZO), zinc oxide (ZnO), or an organic transparent conductive material. As the photoelectric conversion layer 10 has a flat top surface, the first planarized layer 301 may not be provided if necessary.

The light-shield layer GR may be provided on the transparent conductive layer TEL. The light-shield layer GR may be positioned on the active region AR and the peripheral region PR of the semiconductor substrate 100. In an exemplary embodiment of the present inventive concept, the light-shield layer GR may include metal materials, such as tungsten (W), copper (Cu), hafnium (Hf), zirconium (Zr), titanium (Ti), tantalum (Ta), aluminum (Al), ruthenium (Ru), palladium (Pd), platinum (Pt), cobalt (Co), or nickel (Ni).

The light-shield layer GR may have a planar shape similar to that of the first device isolation patterns 120. For example, the light-shield layer GR may have a grid structure. The light-shield layer GR may include first extensions that extend in the first direction D1 and second extensions that extend in the second direction D2. The first and second extensions may intersect each other to define optical transmission regions LPR. For example, the optical transmission regions LPR may be two-dimensionally arranged along the first and second directions D1 and D2. The optical transmission regions LPR may vertically overlap the unit pixels PX. The unit pixels PX may receive light through the optical transmission regions LPR.

The light-shield layer GR may be electrically connected to the pad PAD on the peripheral region PR of the semiconductor substrate 100. For example, a portion of the light-shield layer GR may extend onto the peripheral region PR. The light-shield layer GR and the pad PAD may be electrically connected to each other through a conductive line that extends from the pad PAD and through an upper contact plug TCP between the conductive line and the light-shield layer GR. A negative voltage may be applied to the pad PAD. For example, the pad PAD may be connected to a charge pump, and thus a negative voltage may be applied from the charge pump. The negative voltage may be applied as a constant voltage. The present inventive concept, however, is not limited thereto, and the pad PAD may penetrate the semiconductor substrate 100 on the peripheral region PR to connect to the transfer transistors TX and the logic transistors RX, SX, and DX, or may be used for various electrical connections.

The color filters 303 may be provided on the transparent conductive layer TEL and the light-shield layer GR. The color filters 303 may be respectively disposed on the unit pixels PX. The color filters 303 may constitute a primary color filter array. For example, the color filters 303 may be formed of a combination of a green color filter, a blue color filter, and a red color filter. The color filters 303 may be arranged in Bayer pattern format.

The microlenses 307 may be respectively provided on the color filters 303. A second planarized layer 305 may be interposed between the color filters 303 and the microlenses 307.

Figure 9:
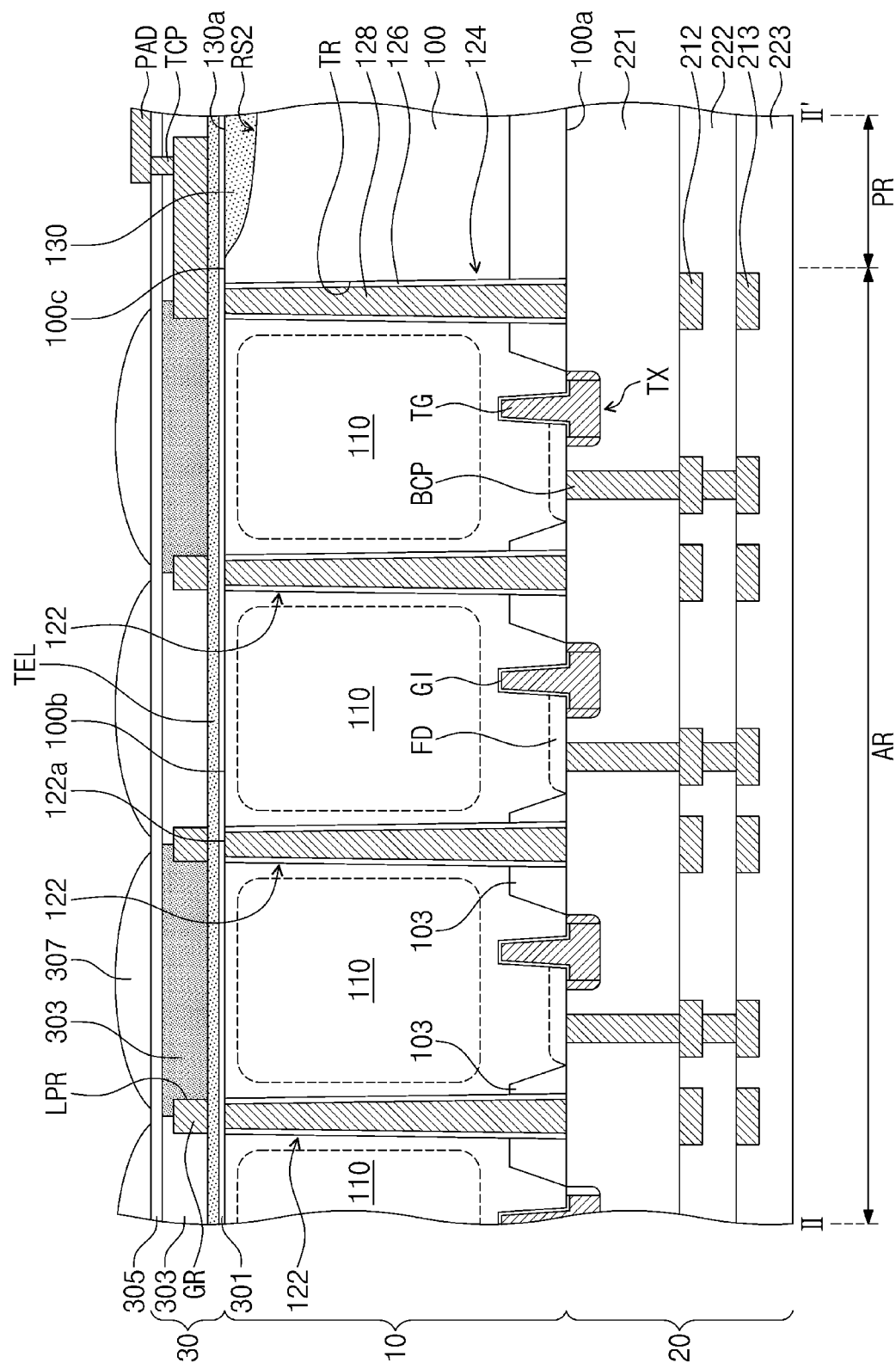
FIG. 9 is a cross-sectional view illustrating an image sensor according to an exemplary embodiment of the present inventive concept.

FIG. 9 illustrates a cross-sectional view that shows an image sensor according to an exemplary embodiment of the present inventive concept. In the embodiments that follow, components the same as those discussed with reference to FIGS. 1 to 8 are allocated the same reference numerals thereto, and a repetitive explanation thereof will be omitted or abridged for convenience of description. The following description will focus on differences between the embodiments of FIGS. 1 to 8 and other embodiments described below.

As illustrated in FIG. 9, the first device isolation patterns 120 may include first sub-device isolation patterns 122, which are positioned on the central portion of the active region AR, and second sub-device isolation patterns 124, which are positioned on the peripheral portion of the active region AR.

In an exemplary embodiment of the present inventive concept, the top surface 122a of each of the first sub-device isolation patterns 122 may be substantially flat. Further, the top surfaces 122a of the first sub-device isolation patterns 122 may be parallel to the first surface 100a of the semiconductor substrate 100. In addition, the top surfaces 122a of the first sub-device isolation patterns 122 may be located at the same level from the first surface 100a of the semiconductor substrate 100. For example, the top surfaces 122a of the first sub-device isolation patterns 122 may be positioned on a substantially flat plane. The top surfaces 122a of the first sub-device isolation patterns 122 may be coplanar with the second surface 100b of the semiconductor substrate 100. For example, the top surfaces 122a of the first sub-device isolation patterns 122 may be located at the same level as that of the third surface 100c of the semiconductor substrate 100 on the peripheral region PR.

The top surface 124a of each of the second sub-device isolation patterns 124 may be substantially flat. The top surfaces 124a of the second sub-device isolation patterns 124 may be parallel to the first surface 100a of the semiconductor substrate 100. In addition, the top surfaces 124a of the second sub-device isolation patterns 124 may be located at the same level as that of the top surfaces 122a of the first sub-device isolation patterns 122, from the first surface 100a of the semiconductor substrate 100. For example, the top surfaces 124a of the second sub-device isolation patterns 124 may be located on a substantially flat plane. The top surfaces 122a of the first sub-device isolation patterns 122 may be located at the same plane. The top surfaces 124a of the second sub-device isolation patterns 124 may be coplanar with the second surface 100b of the semiconductor substrate 100. For example, the top surfaces 124a of the second sub-device isolation patterns 124 may be located at the same level as that of the third surface 100c of the semiconductor substrate 100 on the peripheral region PR.

On the peripheral region PR, the third surface 100c of the semiconductor substrate 100 may have a second recess RS2. The second recess RS2 may be formed to extend from the third surface 100c toward the first surface 100a of the semiconductor substrate 100. On the peripheral region PR, the second recess RS2 may be disposed adjacent to and spaced apart from the second sub-device isolation patterns 124. The second recess RS2 may have a bottom surface RS2a that is inclined to the third surface 100c of the semiconductor substrate 100. For example, the bottom surface RS2a of the second recess RS2 may approach to the first surface 100a of the semiconductor substrate 100 in a direction away from the active region AR.

In an exemplary embodiment of the present inventive concept, a planarized pattern 130 may be provided in the second recess RS2. The planarized pattern 130 may completely fill the second recess RS2. The planarized pattern 130 may have a top surface 130a which is substantially flat. The top surface 130a of the planarized pattern 130 may be parallel to the first surface 100a of the semiconductor substrate 100. In addition, the top surface 130a of the planarized pattern 130 may be coplanar with the third surface 100c of the semiconductor substrate 100. In addition, the planarized pattern 130 may include the same material as that of the dielectric isolation pattern 126 of the first device isolation pattern 120. For example, the planarized pattern 130 may include a silicon oxide (SiO) layer, a silicon oxynitride (SiON) layer, or a silicon nitride (SiN) layer.

According to an exemplary embodiment of the present inventive concept, as the planarized pattern 130 is provided in the second recess RS2 formed in the semiconductor substrate 100 in image sensor fabrication process, the photoelectric conversion layer 10 may have a flat top surface. The optical transmission layer 30 provided on the semiconductor substrate 100 may be in close contact with or attached to the photoelectric conversion layer 10, and a profile of the second surface 100b of the semiconductor substrate 100 may prevent the optical transmission layer 30 from being delaminated from the photoelectric conversion layer 10.

FIGS. 10 to 15 illustrate cross-sectional views that show a method of fabricating an image sensor according to an exemplary embodiment of the present inventive concept. FIGS. 10 to 15 correspond to a cross-section taken along line II-II' of FIG. 5.

Figure 10:
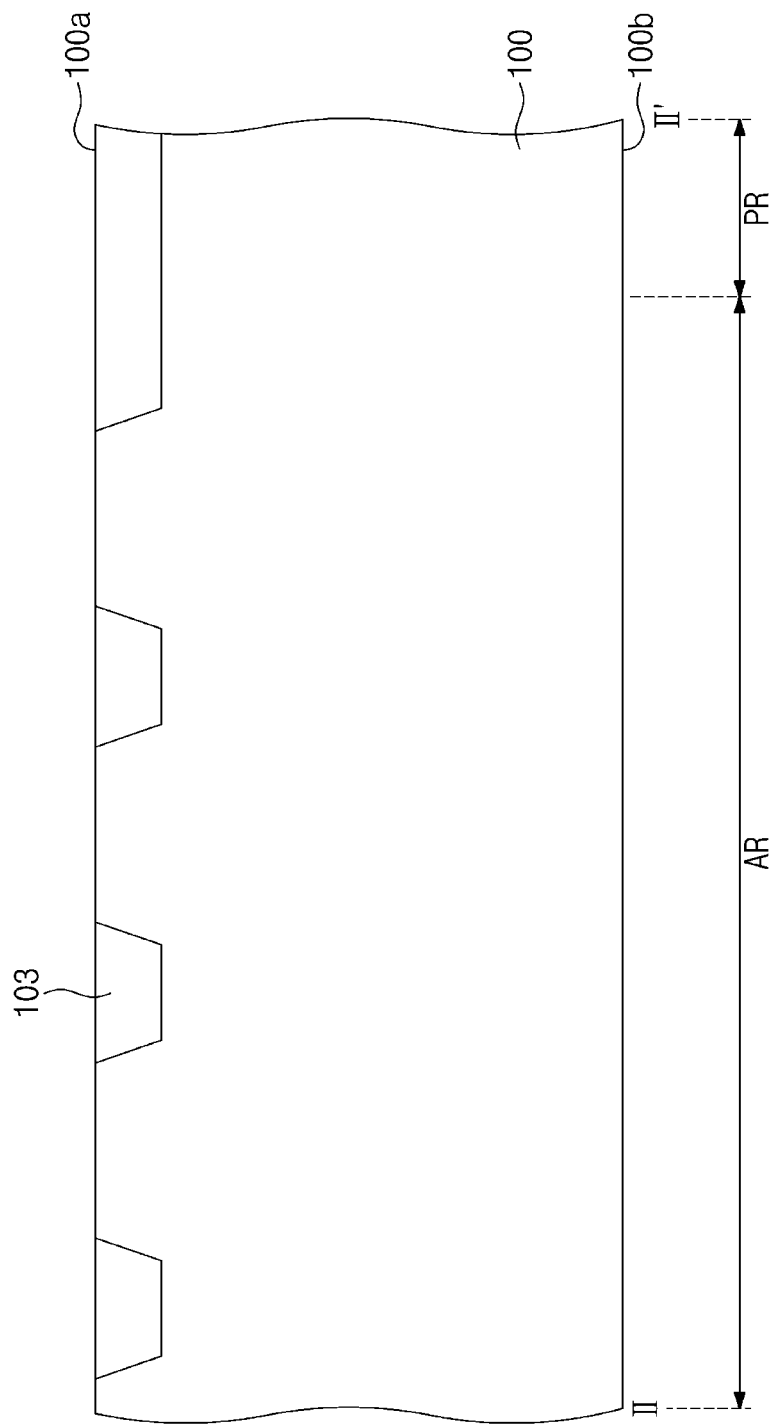

As illustrated in FIGS. 3, 5, and 10, a semiconductor substrate 100 may be provided. The semiconductor substrate 100 may have a first surface 100a and a second surface 100b, where the first surface 100a and the second surface 100b are opposite to each other. The semiconductor substrate 100 may include an active region AR disposed on a center thereof and a peripheral region PR at least partially surrounding the active region AR.

In an exemplary embodiment of the present inventive concept, a second device isolation pattern 103 may be formed on the first surface 100a of the semiconductor substrate 100. The second device isolation pattern 103 may define active patterns.

Figure 11:
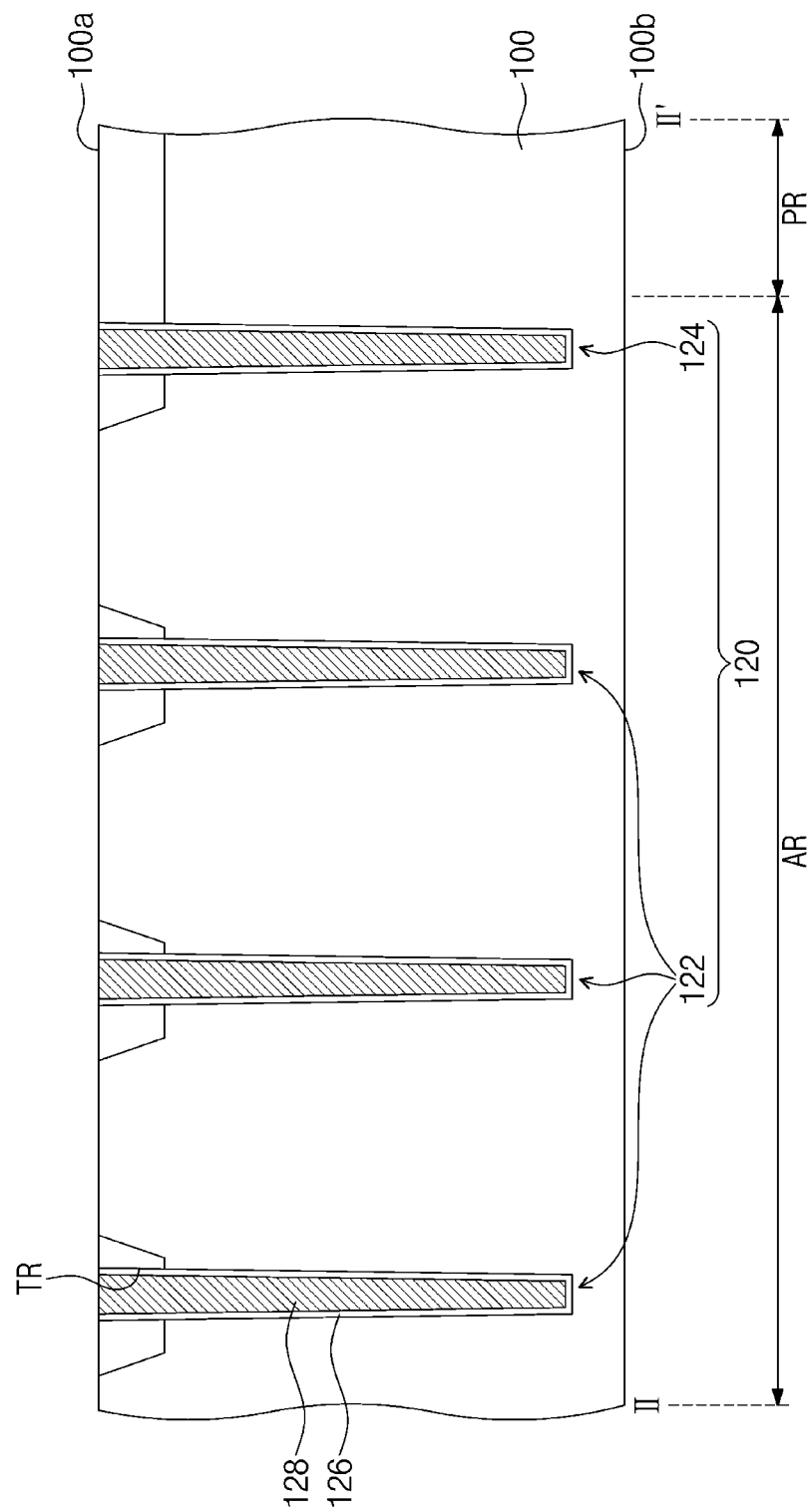

As illustrated in FIGS. 3, 5, and 11, the first surface 100a of the semiconductor substrate 100 may perform an etching process to form a trench TR. The trench TR may have a width which gradually decreases in a direction from the first surface 100a toward the second surface 100b of the semiconductor substrate 100. When viewed in a plan view, the trench TR may be formed to have a grid structure. The trench TR may define a plurality of unit pixels PX on the active region AR.

In an exemplary embodiment of the present inventive concept, a plurality of first device isolation patterns 120 may be formed to fill the trench TR. The first device isolation patterns 120 may each include a dielectric isolation pattern 126 and a conductive isolation pattern 128. The formation of the dielectric patterns 126 and the conductive isolation patterns 128 may include conformally forming a dielectric layer that partially fills the trench TR, forming on the dielectric layer a conductive layer fillings the trench TR, and performing a planarization process on the dielectric and conductive layers until the first surface 100a of the semiconductor substrate 100 is exposed. For example, the dielectric isolation pattern 126 may include a silicon oxide (SiO) layer, a silicon oxynitride (SiON) layer, or a silicon nitride (SiN) layer. The conductive isolation pattern 128 may include n-type doped polysilicon or p-type doped polysilicon.

Figure 12:
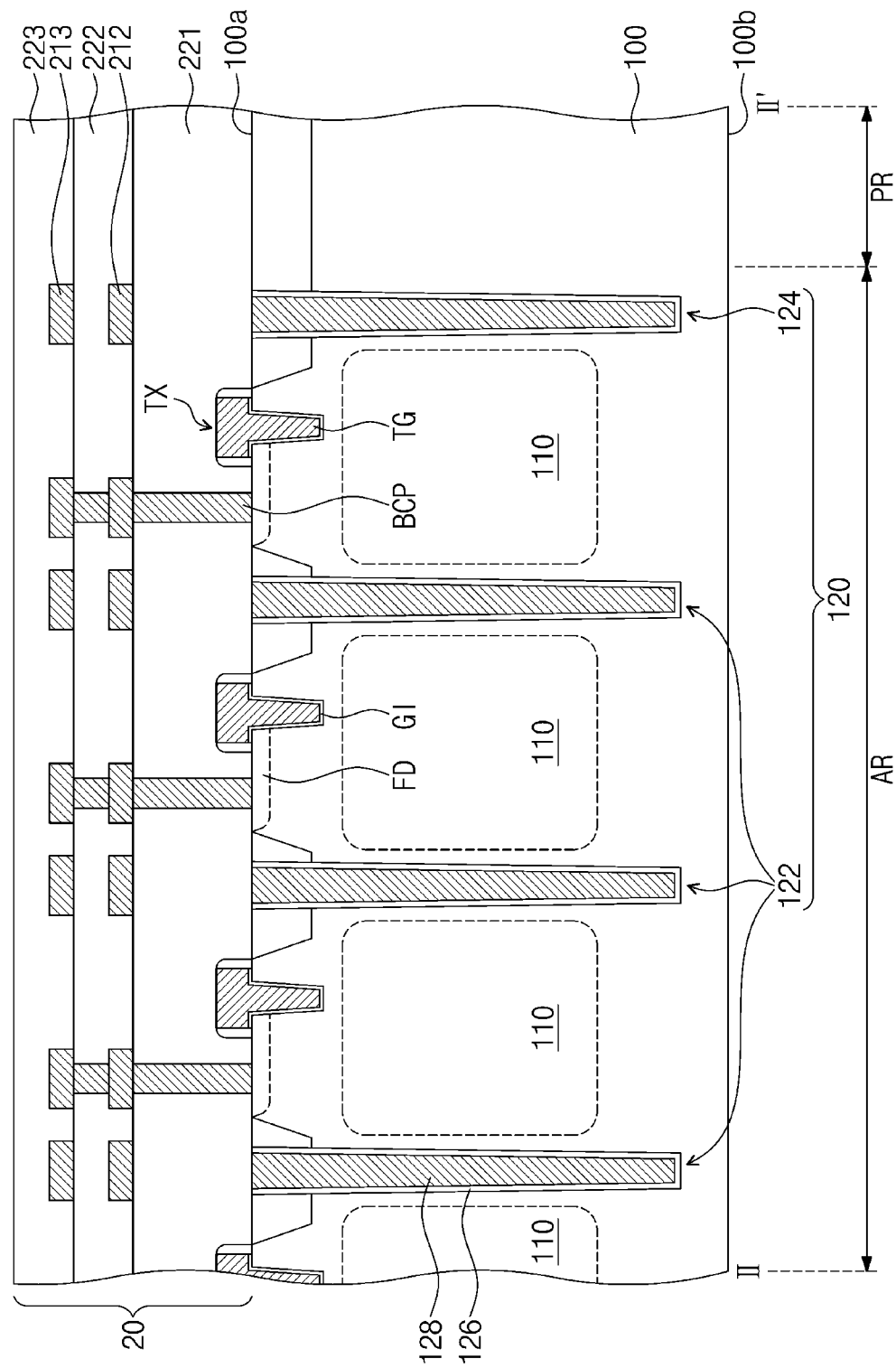

As illustrated in FIGS. 3, 5, and 12, a wiring layer 20 may be formed on the semiconductor substrate 100.

The active patterns may each be doped with impurities to form a floating diffusion region FD and an impurity region DR. The transfer transistors TX and the logic transistors RX, SX, and DX discussed above with reference to FIG. 2 may be formed on the active patterns.

The first, second, and third interlayer dielectric layers 221, 222, and 223 may be formed on the first surface 100a of the semiconductor substrate 100. First and second conductive line patterns 212 and 213 may be respectively formed in the second and third interlayer dielectric layers 222 and 223, and lower contact plugs BCP may be formed to connect to the first and second conductive line patterns 212 and 213.

Figure 13:
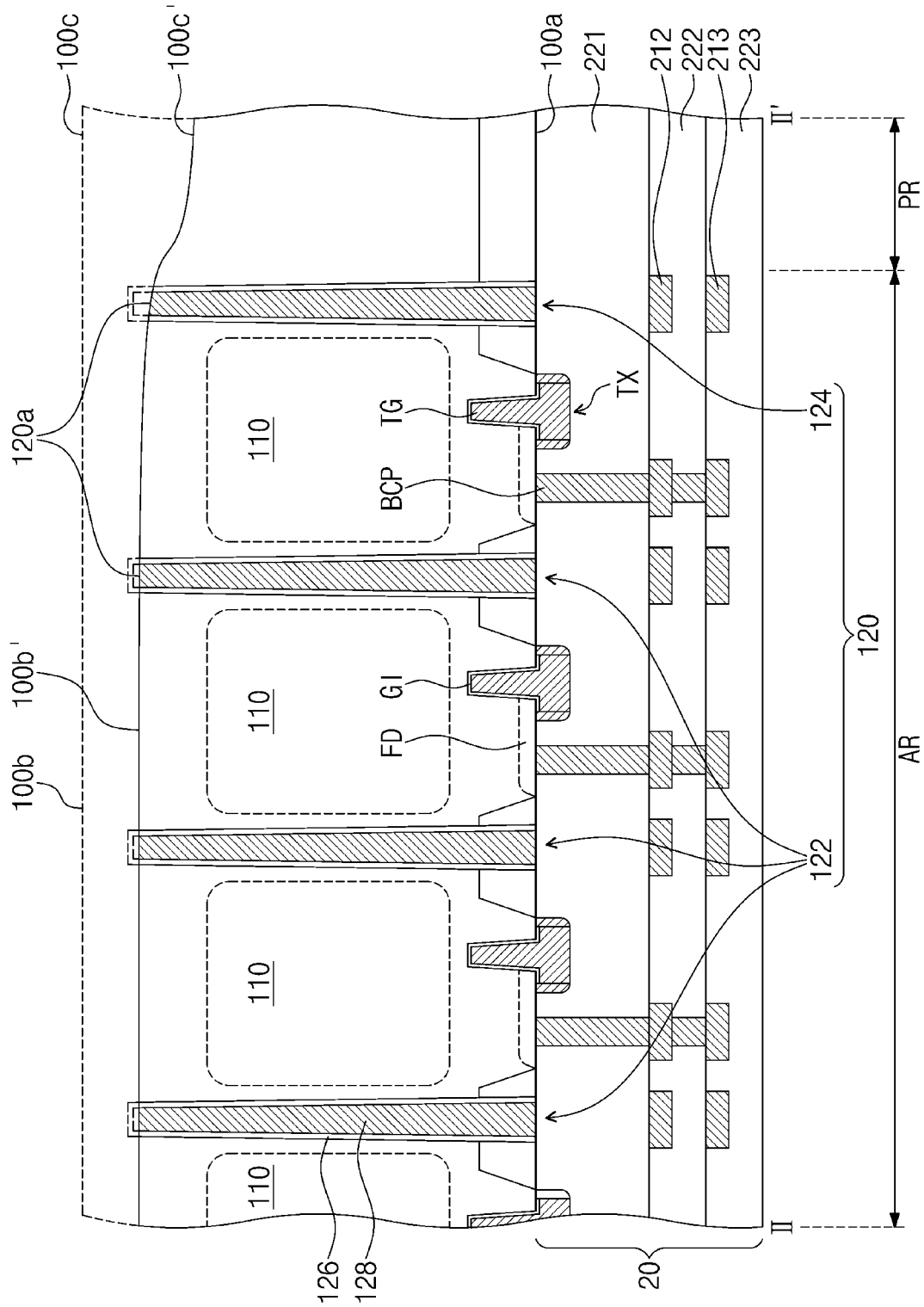

Referring to FIGS. 3, 5, and 13, the second surface 100b of the semiconductor substrate 100 may perform a first planarization process to expose the first device isolation patterns 120. The first planarization process may include a chemical mechanical polishing (CMP) process. In an exemplary embodiment of the present inventive concept, the first planarization process may remove a portion of the semiconductor substrate 100, and may expose top surfaces of the first device isolation patterns 120. At this step, the dielectric isolation pattern 126 of the first device isolation pattern 120 may have an exposed top surface, and the conductive isolation pattern 128 of the first device isolation pattern 120 may have an exposed top surface. As the first planarization process is a thinning process for removing a portion of the semiconductor substrate 100, the first planarization process may use a first etchant whose target is the semiconductor substrate 100. For example, the first etchant may have an etch rate higher for a second material (e.g., silicon (Si)) included in the semiconductor substrate 100 than for a first material (e.g., silicon oxide (SiO), silicon oxynitride (SiON), or silicon nitride (SiN)) included in the first device isolation patterns 120 exposed during the first planarization process.

In an exemplary embodiment of the present inventive concept, the first planarization process is performed on the second surface 100b of the semiconductor substrate 100. The semiconductor substrate 100 may have therein different materials on different regions in the vicinity of the second surface 100b of the semiconductor substrate 100. For example, the first material included in the first device isolation patterns 120 may be present on the active region AR of the semiconductor substrate 100, and the second material included in the semiconductor substrate 100 may be present on the peripheral region PR of the semiconductor substrate 100. Therefore, in this example, in the first planarization process, an etching depth at the peripheral region PR may be greater than an etching depth at the active region AR. For example, a second surface 100b' of the semiconductor substrate 100 on the active region AR or top surfaces 120a of the first device isolation patterns 120 may be located at a higher level than that of a third surface 100c' of the semiconductor substrate 100 on the peripheral region PR. In this description below, second and third surfaces of the semiconductor substrate 100 before the first planarization process are respectively designated by 100b and 100c, and second and third surfaces of the semiconductor substrate 100 after the first planarization process are respectively designated by the second surface 100b' and the third surface 100c'.

In addition, in a case of the chemical mechanical polishing (CMP) process, a polishing target may be partially over-etched at an outermost portion thereof. In a case of the first planarization process, the top surfaces 120a of the first device isolation patterns 120 and the second surface 100b' of the semiconductor substrate 100 may approach the first surface 100a of the semiconductor substrate 100 in a direction toward the peripheral region PR. For example, after the first planarization process, an entirety of the second surface 100b' of the semiconductor substrate 100 may have a profile in which the active region AR is more convex than the peripheral region PR. The convex profile may correspond to a step difference formed on the semiconductor substrate 100. The convex profile of the second surface 100b' may induce delamination of one or more components formed on the second surface 100b' of the semiconductor substrate 100.

Figure 14:
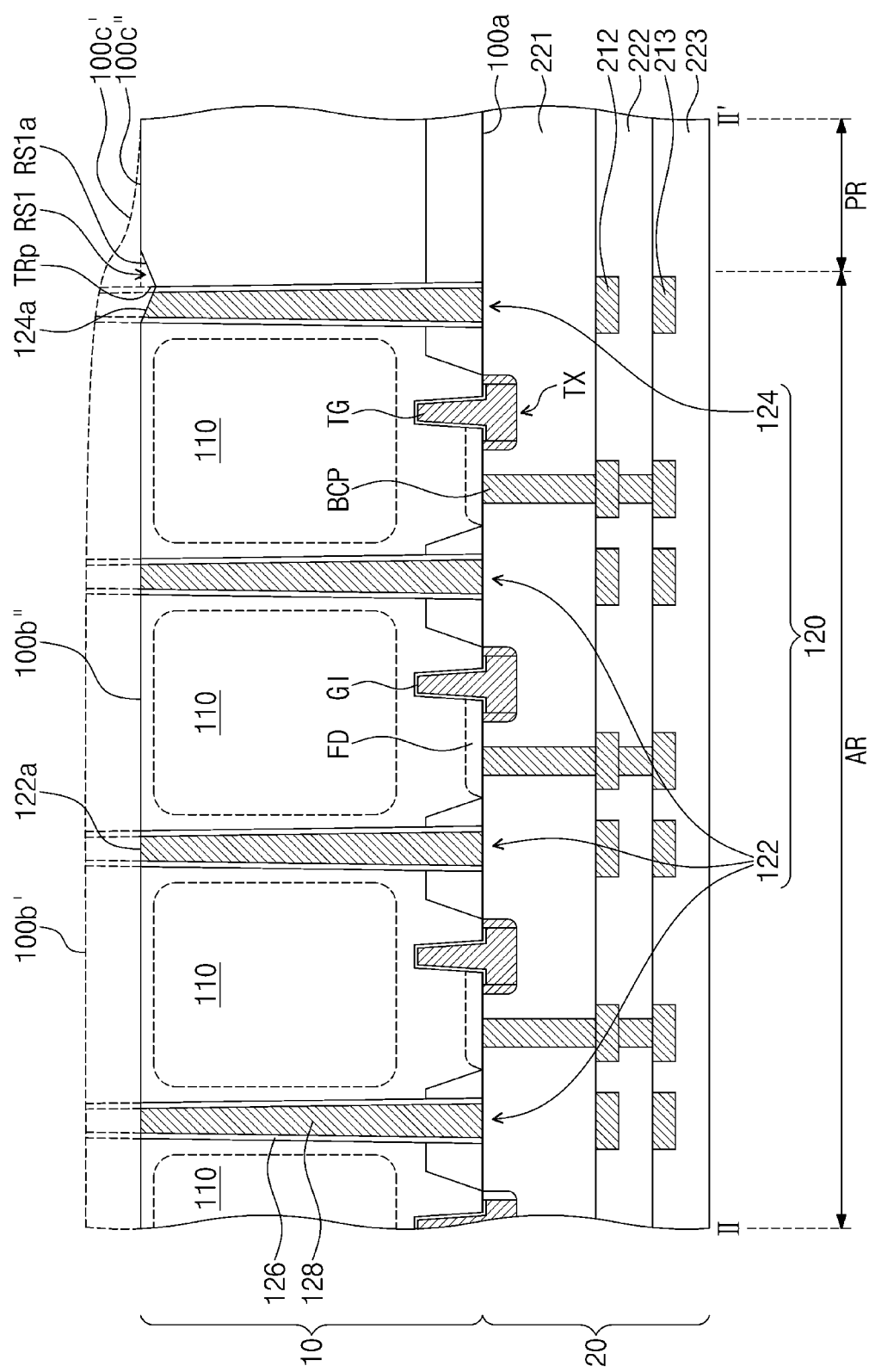

Referring to FIGS. 3, 5, and 14, a second planarization process may be performed on the second surface 100b' of the semiconductor substrate 100. The second planarization process may include a chemical mechanical polishing (CMP) process. The second planarization process may a process for flatting the second surface 100b' of the semiconductor substrate 100. For example, the second planarization process may be performed on a convex portion at the second surface 100b' of the semiconductor substrate 100. Therefore, on the active region AR, upper portions of the first device isolation patterns 120 may be partially removed. At this step, an upper portion of the semiconductor substrate 100 positioned on the active region AR may also be partially removed. The second planarization process may continue until the top surfaces 120a of the first device isolation patterns 120 and the second surface 100b' of the semiconductor substrate 100 on the active region AR become located at the same level as that of a third surface 100c" of the semiconductor substrate 100 on the peripheral region PR. In this description below, second and third surfaces of the semiconductor substrate 100 before the second planarization process are respectively designated by 100b' and 100c', and second and third surfaces of the semiconductor substrate 100 after the second planarization process are respectively designated by 100b" and 100c".

As the second planarization process removes portions of the first device isolation patterns 120 and does not remove the semiconductor substrate 100 on the peripheral region PR, the second planarization process may use a second etchant whose target is the first device isolation patterns 120. For example, the second etchant may have an etch rate that is higher for a first material (e.g., silicon oxide (SiO), silicon oxynitride (SiON), or silicon nitride (SiN)) included in the first device isolation patterns 120 than for a second material (e.g., silicon (Si)) included in the semiconductor substrate 100. In the second planarization process, an etching amount (or etching depth) on the active region AR may be greater than an etching amount (or etching depth) on the peripheral region PR. Therefore, after the second planarization process, the second surface 100b' of the semiconductor substrate 100 may have a profile in which a convex portion is removed and which is flat as a whole.

According to an exemplary embodiment of the present inventive concept, it may be possible to remove from the semiconductor substrate 100 the step difference formed in the first planarization process performed for exposing the first device isolation patterns 120, to form a photoelectric conversion layer 10 having a flat top surface, and to easily form an optical transmission layer 30 in a subsequent process.

Referring to FIGS. 3, 5, and 14 together with FIG. 4, at the step of the second planarization process, a chemical mechanical polishing (CMP) process may be used to perform the second planarization process. In a case of the chemical mechanical polishing (CMP) process, a polishing target may be partially over-etched at an outermost portion of the target. In a case of the second planarization process, an etching target of the second etchant may be the first device isolation patterns 120, and thus the outermost positioned second sub-device isolation patterns 124 of the first device isolation patterns 120 may be over-etched. The over-etching of the second sub-device isolation patterns 124 may form an empty partial area TRp on a trench TR positioned on top surfaces 124a of the second sub-device isolation patterns 124.

For example, after the second planarization process, the first device isolation patterns 120 may have first sub-device isolation patterns 122 which are positioned on a central portion of the active region AR and whose top surfaces 122a are located at the same level as that of the third surface 100c" of the semiconductor substrate 100 on the peripheral region PR, and the top surfaces 122a of the first sub-device isolation patterns 122 and the third surface 100c" of the semiconductor substrate 100 may be provided on a substantially flat plane. After the second planarization process, among the first device isolation patterns 120, the second sub-device isolation patterns 124 may have their top surfaces 124a located at a lower level than that of the top surfaces 122a of the first sub-device isolation patterns 122 and that of the third surface 100c" of the semiconductor substrate 100. At this step, the top surfaces 124a of the second sub-device isolation patterns 124 may be formed inclined to the second surface 100b" of the semiconductor substrate 100. The top surfaces 124a of the second sub-device isolation patterns 124 may approach the first surface 100a of the semiconductor substrate 100 in a direction toward the peripheral region PR.

According to an exemplary embodiment, the second sub-device isolation patterns 124 may be over-etched such that the semiconductor substrate 100 may also be etched at its portion adjacent to the second sub-device isolation patterns 124. For example, during the second planarization process, a first recess RS1 may be formed on the peripheral region PR. Because the formation of the first recess RS1 is induced by the over-etching of the second sub-device isolation patterns 124, the first recess RS1 may be formed on the second sub-device isolation patterns 124, and a bottom surface RS1a of the first recess RS1 may approach to the first surface 100a of the semiconductor substrate 100 in a direction toward the second sub-device isolation patterns 124. For example, the first recess RS1 may be formed to contact the second sub-device isolation patterns 124. The present inventive concept, however, is not limited thereto, and the first recess RS1 may not be formed based on a process or a kind of etchant used for the process.

Figure 15:
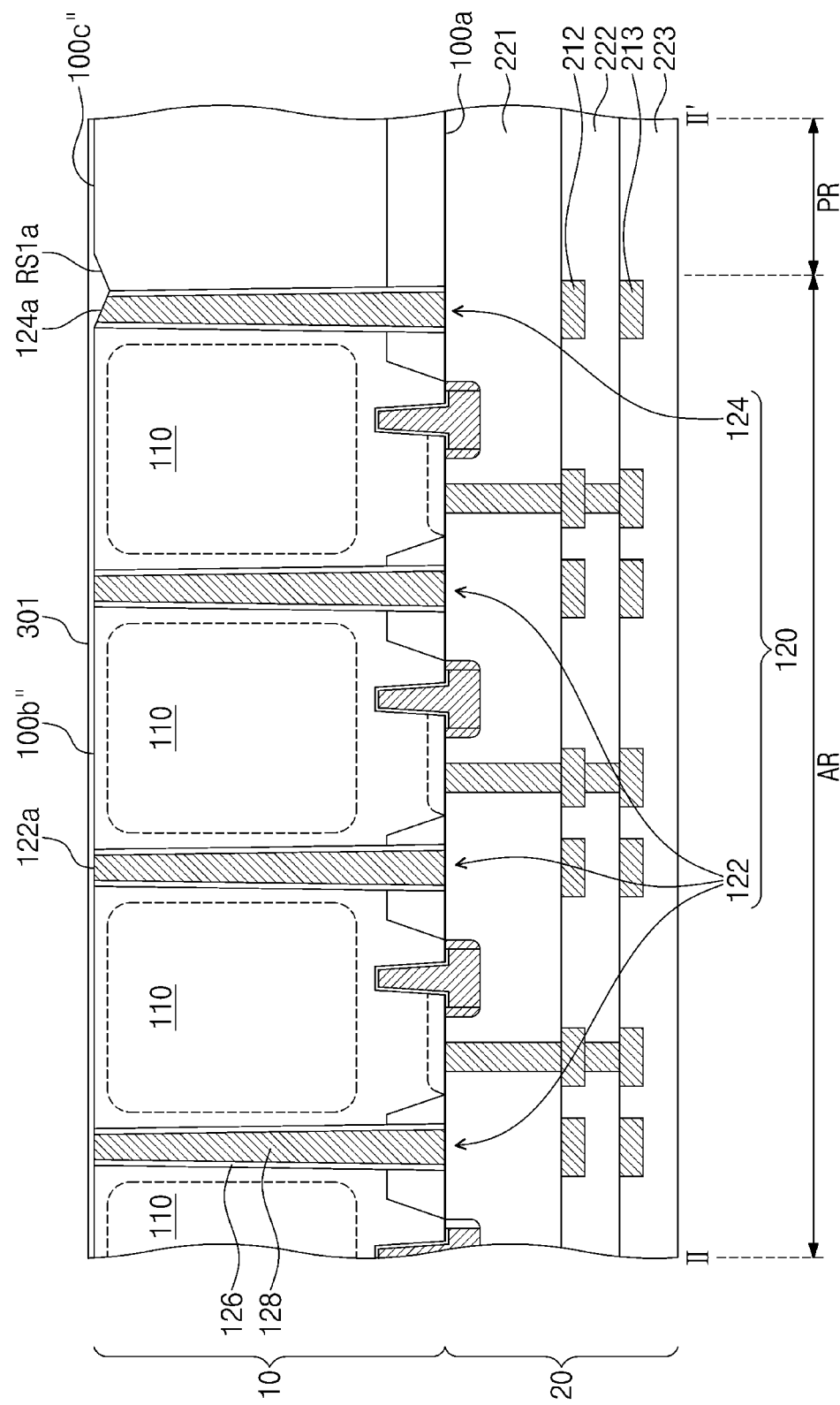

Referring to FIGS. 3, 5, and 15, a first planarized layer 301 may be formed on the second surface 100b" of the semiconductor substrate 100. The first planarized layer 301 may cover the second surface 100b" of the semiconductor substrate 100 and exposed top surfaces of the first device isolation patterns 120. The first planarized layer 301 may fill the first recess RS1 and the partial area TRp on the trench TR that is positioned on the top surfaces 124a of the second sub-device isolation patterns 124. For example, the first planarized layer 301 may fill an indentation or groove formed by the top surface 124a of the second sub-device isolation pattern 124 and the first recess RS1.

Referring back to FIGS. 3, 5, and 6, a transparent conductive layer TEL may be formed on the first planarized layer 301. A light-shield layer GR may be formed on the transparent conductive layer TEL. The light-shield layer GR may be formed to have a grid structure. A plurality of color filters 303 may be formed on the light-shield layer GR. The color filters 303 may be formed on corresponding unit pixels PX. A plurality of microlenses 307 may be formed on the color filters 303.

Figure 16:
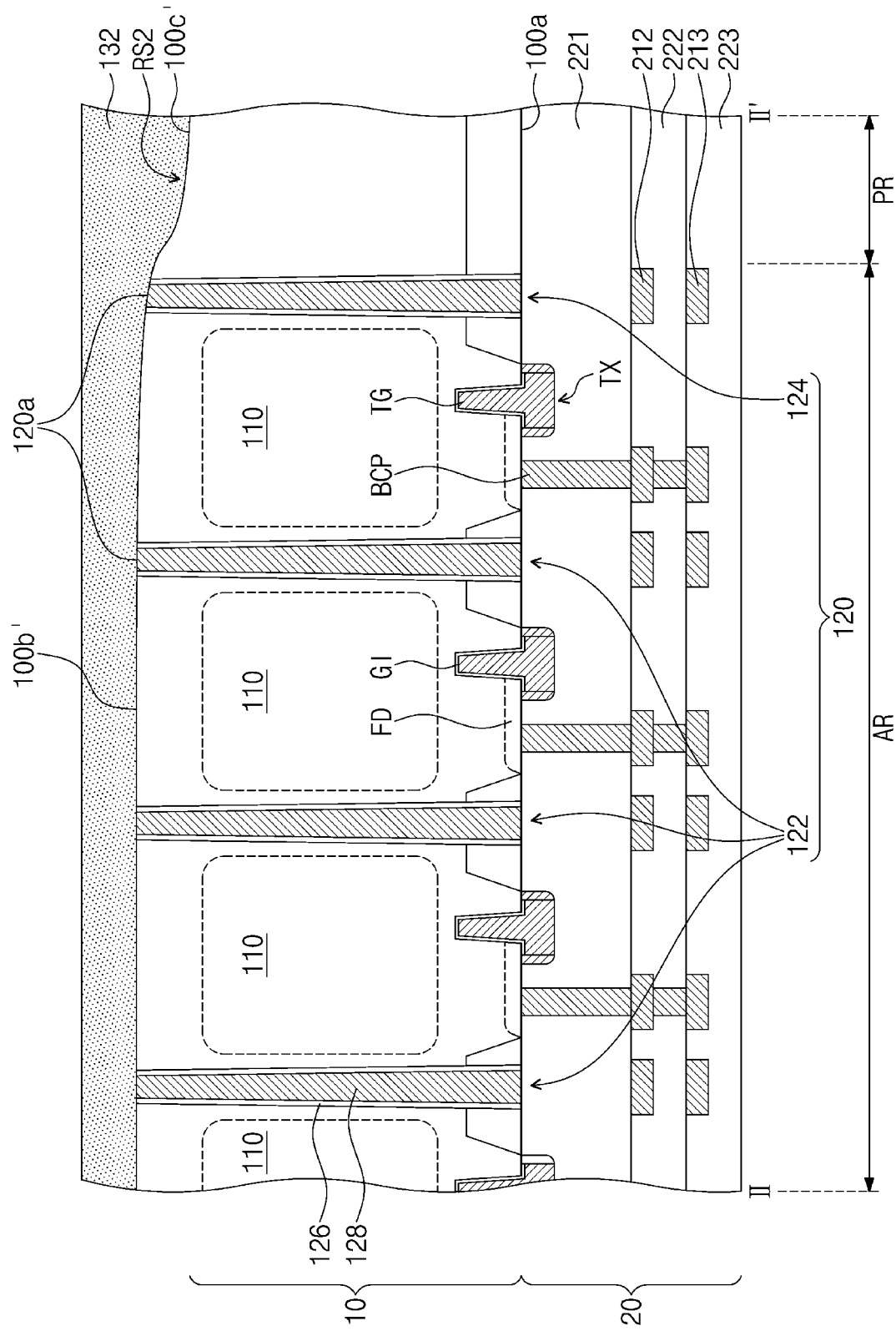

FIGS. 16 and 17 illustrate cross-sectional views that show a method of fabricating an image sensor according to an exemplary embodiment of the present inventive concept. FIGS. 16 and 17 correspond to a cross-section taken along line II-II' of FIG. 5.

Referring to FIGS. 3, 5, and 16, a planarized material layer 132 may be formed on a resultant structure of FIG. 13. For example, the planarized material layer 132 may be formed on the semiconductor substrate 100. On the active region AR and the peripheral region PR, the planarized material layer 132 may cover the semiconductor substrate 100 and the first device isolation patterns 120. On the peripheral region PR, the planarized material layer 132 may fill a second recess RS2. In this description, the second recess RS2 may indicate a portion of the third surface 100c' of the semiconductor substrate 100, the portion of the third surface 100c' has a shape that is more recessed on the peripheral region PR than on the active region AR. The planarized material layer 132 may include the same material as that of the dielectric isolation pattern 126 of the first device isolation pattern 120. For example, the planarized material layer 132 may include a silicon oxide (SiO) layer, a silicon oxynitride (SiON) layer, or a silicon nitride (SiN) layer.

Referring to FIGS. 3, 5, and 17, the planarized material layer 132 may undergo a third planarization process to expose the first device isolation patterns 120. The third planarization process may include, for example, a chemical mechanical polishing (CMP) process. The third planarization process may continue until all of the top surfaces of the first device isolation patterns 120 are exposed. The third planarization process may remove a portion of the planarized material layer 132 and may expose the top surfaces 122a and 124a of the first device isolation patterns 120. At this step, the dielectric isolation pattern 126 of the first device isolation pattern 120 may have an exposed top surface, and the conductive isolation pattern 128 of the first device isolation pattern 120 may have an exposed top surface. The third planarization process may remove the planarized material layer 132 on the active region AR. The third planarization process may partially remove an upper portion of the semiconductor substrate 100 on the active region AR and an upper portion of each of the first device isolation patterns 120.

As the third planarization process is a thinning process for removing a portion of the planarized material layer 132, the third planarization process may use a third etchant whose target is the planarized material layer 132. For example, the third etchant may have an etch rate that is higher for a second material (e.g., silicon (Si)) included in the semiconductor substrate 100 than for a third material (e.g., silicon oxide (SiO), silicon oxynitride (SiON), or silicon nitride (SiN)) included in the planarized material layer 132 that is exposed during the third planarization process.

As the third surface 100c of the semiconductor substrate 100 has a profile that is more recessed than the second surface 100b on the active region AR, a portion of the planarized material layer 132 may remain in the second recess RS2 during the third planarization process. Therefore, after the third planarization process, the second surface 100b" of the semiconductor substrate 100 on the active region AR, the third surface 100c" of the semiconductor substrate 100 on the peripheral region PR, the top surfaces 122a of the first sub-device isolation patterns 122, the top surfaces 124a of the second sub-device isolation patterns 124, and the top surface 130a of the planarized pattern 130 may all be substantially flat. Further, the surfaces 100b", 100c", 122a, 124a, and 130a may be substantially coplanar with each other. For example, the second surface 100b" of the semiconductor substrate 100 on the active region AR, the third surface 100c" of the semiconductor substrate 100 on the peripheral region PR, the top surfaces 122a of the first sub-device isolation patterns 122, the top surfaces 124a of the second sub-device isolation patterns 124, and the top surface 130a of the planarized pattern 130 may be provided on the same plane as one another.

Referring to FIGS. 3, 5, and 9, a first planarized layer 301 may be formed on the second surface 100b" of the semiconductor substrate 100. The first planarized layer 301 may cover the second surface 100b" of the semiconductor substrate 100 and exposed top surfaces of the first device isolation patterns 120. The first planarized layer 301 may fill the second recess RS2.

In an exemplary embodiment of the present inventive concept, a transparent conductive layer TEL may be formed on the first planarized layer 301. A light-shield layer GR may be formed on the transparent conductive layer TEL. The light-shield layer GR may be formed to have a grid structure.

A plurality of color filters 303 may be formed on the light-shield layer GR. The color filters 303 may be formed on corresponding unit pixels PX. A plurality of microlenses 307 may be formed on the color filters 303.

For an image sensor according to an exemplary embodiment of the present inventive concept, a photoelectric conversion layer may have a flat top surface, an optical transmission layer provided on a semiconductor substrate may be in close contact with or attached to the photoelectric conversion layer, and a top surface of the semiconductor substrate may have a profile that prevents the optical transmission layer from being delaminated from the photoelectric conversion layer.

In addition, as a uniform thickness is given to the semiconductor substrate in which unit pixels are provided, there may be a reduction in difference in sensing sensitivity and an increase in sensing properties of the image sensor.

A method of fabricating an image sensor according to an exemplary embodiment of the present inventive concept may remove from a semiconductor substrate a step difference formed in a planarization process performed for exposing device isolation patterns, may form a photoelectric conversion layer having a flat top surface, and may easily form an optical transmission layer in a subsequent process.

While the inventive concept has been particularly shown and described with reference to the exemplary embodiments thereof, it will be understood by one of ordinary skill in the art that variations in form and detail may be made therein without departing from the spirit and scope of the inventive concept as defined by the following claims.

What is claimed is:

1. An image sensor, comprising:
a substrate that includes an active region and a peripheral region;
a plurality of unit pixels disposed on the active region;
a plurality of device isolation patterns, wherein the plurality of unit pixels is defined by the plurality of device isolation patterns:
a light-shield layer disposed on the substrate and having a grid structure, wherein a plurality of optical transmission regions is defined based on the grid structure;
a plurality of color filters disposed on the light-shield layer; and
a plurality of microlenses disposed on the color filters,
wherein the device isolation patterns include a plurality of first device isolation patterns and a second device isolation pattern, wherein the first device isolation patterns are disposed on a central portion of the active region, and the second device isolation pattern is disposed between the first device isolation patterns and the peripheral region,
wherein each of the plurality of first device isolation patterns has a first top surface parallel to a bottom surface of the substrate; and
wherein the second device isolation pattern has a second top surface,
wherein the second top surface of the second sub-device isolation pattern has a lowermost end that is nearest to the peripheral region, and an uppermost end that stands opposite to the peripheral region, and
wherein the second top surface approaches the bottom surface of the substrate in a direction to the lowermost end from the uppermost end toward the peripheral region.

2. The image sensor of claim 1, wherein an uppermost end of the second top surface of the second device isolation patter is at a level the same as a level of the first top surface of a first device isolation pattern of the plurality of device isolation patterns.

3. The image sensor of claim 2, wherein a height difference between a height of the uppermost end of the second top surface of the second device isolation pattern and a height of the lowermost end of the second top surface of the second device isolation pattern ranges from about 1 µm to about 2 µm.

4. The image sensor of claim 1, wherein the first top surface of each of the first device isolation patterns is at a level the same as a level of a top surface of the substrate on the peripheral region.

5. The image sensor of claim 1, wherein
the substrate has a recess on a top surface of the substrate on the peripheral region, and
the recess is disposed on the second device isolation pattern at a boundary between the peripheral region and the active region.

6. The image sensor of claim 5, wherein
a bottom surface of the recess approaches the bottom surface of the substrate in a direction toward the active region, and
a lowermost end of the bottom surface of the recess is at a level the same as a level of the lowermost end of the second top surface of the second device isolation pattern.

7. The image sensor of claim 1, wherein a top surface of the substrate on the peripheral region is parallel to the bottom surface of the substrate.

8. The image sensor of claim 1, wherein the substrate includes silicon (Si), and the device isolation patterns include silicon oxide (SiO), silicon nitride (SiN), or silicon oxynitride (SiON).

9. The image sensor of claim 1, wherein the device isolation patterns penetrate the substrate, and each of the device isolation patterns includes:
a conductive isolation pattern; and
a dielectric isolation pattern disposed between the conductive isolation pattern and the substrate.

10. The image sensor of claim 1, wherein each of the plurality of unit pixels includes a photoelectric conversion region.

11. The image sensor of claim 1, further comprising:
a plurality of transfer transistors and a plurality of logic transistors disposed on the substrate; and
a conductive line pattern disposed in an interlayer dielectric layer and electrically connected to the transfer transistors and the logic transistors, wherein the interlayer dielectric layer is disposed on the substrate.

12. An image sensor, comprising:
a substrate including an active region and a peripheral region at least partially surrounding the active region;
a plurality of device isolation patterns extending from a top surface of the substrate and penetrating the substrate on the active region, wherein a plurality of unit pixels is disposed between the plurality of device isolation patterns;
a plurality of photoelectric conversion regions in the substrate and at the plurality of unit pixels;
a plurality of impurity regions in the substrate and respectively at the plurality of unit pixels, wherein the plurality of impurity regions is adjacent to a bottom surface of the substrate;
a conductive line pattern in the substrate or on the bottom surface of the substrate, wherein the conductive line pattern vertically overlaps the device isolation pattern;
a color filter disposed on the top surface of the substrate; and
a microlens array disposed on the color filter,
wherein a plurality of first device isolation patterns that are outermost positioned among the device isolation patterns have a first top surface at a level lower than a level of the top surface of the substrate on the peripheral region, and
wherein each of a plurality of second device isolation patterns of the device isolation patterns has a second top surface on the same plane as the top surface of the substrate on the peripheral region, wherein the second device isolation patterns are in an area surrounded by the first device isolation patterns.

13. The image sensor of claim 12,
wherein the first top surface of the first device isolation patterns approaches the bottom surface of the substrate in a direction toward the peripheral region, and
wherein the second top surface of the second device isolation patterns is parallel to the bottom surface of the substrate.

14. The image sensor of claim 13, wherein an uppermost end of the first top surface of the first device isolation pattern is at a level the same as a level of the second top surface of the second device isolation pattern.

15. The image sensor of claim 14, wherein a height difference between the height of uppermost end of the first top surface of the second device isolation pattern and the height of a lowermost end of the first top surface of the first device isolation pattern ranges from about 1 µm to about 14 µm.

16. The image sensor of claim 13, wherein the top surface of the substrate has a recess, and
a bottom surface of the recess becomes increasingly distant from the bottom surface of the substrate as the recess extends away from a lowermost end of the first top surface, of each of the plurality of first device isolation patterns, in a direction from the active region toward the peripheral region.

17. The image sensor of claim 12, wherein each of the device isolation patterns includes:
a dielectric isolation pattern; and
a conductive isolation pattern in the dielectric isolation pattern.

* * * * *